(12) United States Patent
Fuller et al.

(10) Patent No.: US 8,369,447 B2
(45) Date of Patent: Feb. 5, 2013

(54) PREDISTORTION WITH SECTIONED BASIS FUNCTIONS

(75) Inventors: Arthur Thomas Gerald Fuller, Carp (CA); Bradley John Morris, Ottawa (CA)

(73) Assignee: Apple Inc., Cupertino, CA (US)

( * ) Notice: Subject to any disclaimer, the term of this patent is extended or adjusted under 35 U.S.C. 154(b) by 802 days.

(21) Appl. No.: 12/402,643

(22) Filed: Mar. 12, 2009

(65) Prior Publication Data

US 2009/0302940 A1    Dec. 10, 2009

Related U.S. Application Data

(60) Provisional application No. 61/058,649, filed on Jun. 4, 2008.

(51) Int. Cl.
*H04K 1/02* (2006.01)
(52) U.S. Cl. .......................... 375/296; 375/232
(58) Field of Classification Search .................. 375/296, 375/285, 229, 232
See application file for complete search history.

(56) References Cited

U.S. PATENT DOCUMENTS

| | | | |
|---|---|---|---|
| 5,778,326 A | 7/1998 | Moroto et al. | |
| 6,549,832 B2 | 4/2003 | Nakasako et al. | |
| 6,831,522 B2 | 12/2004 | Watanabe et al. | |
| 7,095,278 B2 | 8/2006 | Fuller et al. | |
| 2002/0188387 A1 | 12/2002 | Woestman et al. | |
| 2004/0258176 A1 | 12/2004 | Mattsson et al. | |
| 2005/0163268 A1* | 7/2005 | McCallister | 375/346 |
| 2005/0190857 A1* | 9/2005 | Braithwaite | 375/296 |
| 2005/0228553 A1 | 10/2005 | Tryon | |
| 2006/0217083 A1 | 9/2006 | Braithwaite | |
| 2007/0063769 A1* | 3/2007 | Jelonnek | 330/149 |
| 2008/0021628 A1 | 1/2008 | Tryon | |
| 2008/0130789 A1* | 6/2008 | Copeland et al. | 375/297 |
| 2008/0144709 A1* | 6/2008 | McCallister et al. | 375/233 |
| 2008/0180171 A1* | 7/2008 | Brobston | 330/149 |
| 2008/0187035 A1* | 8/2008 | Nakamura et al. | 375/232 |
| 2008/0285640 A1* | 11/2008 | McCallister et al. | 375/233 |
| 2009/0124218 A1* | 5/2009 | McCallister et al. | 455/114.2 |
| 2009/0237158 A1* | 9/2009 | Hehn | 330/149 |
| 2009/0259355 A1 | 10/2009 | Li | |
| 2010/0042304 A1 | 2/2010 | Naik et al. | |
| 2011/0066308 A1 | 3/2011 | Yang et al. | |
| 2011/0109158 A1 | 5/2011 | Olsen | |
| 2011/0172867 A1 | 7/2011 | Yu et al. | |

OTHER PUBLICATIONS

Ding et al. "Memory Polynomial Predistorter Based on the Indirect Learning Architecture", pp. 967-971 2002.
Kim et al. "Piecewise Pre-Equalizer Linearization for the Wireless Transmitter with a Doherty Amplifier", pp. 3469-3478, Sep. 2006.
Morgan et al. "A Generalized Memory Polynomial Model for Digital Predistortion of RF Power Amplifiers", pp. 3852-3860, Oct. 2006.

(Continued)

*Primary Examiner* — Emmanuel Bayard
(74) *Attorney, Agent, or Firm* — Meyertons, Hood, Kivlin, Kowert & Goetzel, P.C.

(57) ABSTRACT

A predistortion actuator is provided. The predistortion actuator includes a plurality of branches, each of which implements a basis function that acts on a digital input signal. For at least one of the branches, the respective basis function is a sectioned basis function, where each section of the sectioned basis function corresponds to a respective section of a range of at least one input signal characteristic associated with the digital input signal, such as a value range of a magnitude, a temporal characteristic, or a hybrid of the two. A power amplifier system including the predistortion actuator is also provided. Utilizing sectioned basis functions can potentially reduce the hardware resources necessary to realize the predistortion actuator relative to conventional global basis functions. In addition, signal conditioning during coefficient training can potentially be used to reduce the dynamic range of coefficients associated with each sectioned basis function.

20 Claims, 15 Drawing Sheets

OTHER PUBLICATIONS

European Search Report dated Jul. 21, 2009 from European Application No. 09161852.

United States Office Action from U.S. Appl. No. 12/420,689 dated Sep. 20, 2011 (25 pages).

* cited by examiner

| Basis Type | Without Signal Conditioning | | With Signal Conditioning | |
|---|---|---|---|---|
| | Largest Abs Coefficient Value (Real or Imag) | Required # Extra Bits to Represent | Largest Abs Coefficient Value (Real or Imag) | Required # Extra Bits to Represent |
| General unconstrained global basis functions | 673336.277 | 20 | 598742.618 | 20 |
| Software constrained global basis functions | 12.080 | 4 | 12.065 | 4 |
| Sectioned basis functions global normalization factors ("NL Secs. Type #1") | 51.64 | 6 | 9.911 | 4 |
| Sectioned basis functions global normalization factors ("NL Secs. Type #2") | 96.746 | 7 | 6.436 | 3 |
| Sectioned/global basis hybrid ("NL Secs. Type #3") | 2308.064 | 12 | 2639.550 | 12 |

FIG. 14

PREDISTORTION WITH SECTIONED BASIS FUNCTIONS

RELATED APPLICATION

The present patent application claims the benefit of U.S. Provisional Patent Application No. 61/058,649 filed Jun. 4, 2008, the entire contents of which are incorporated herein by reference.

FIELD OF THE INVENTION

The present invention relates to signal predistortion.

BACKGROUND

One of the goals in power amplifier design for wireless base stations is increased efficiency. Improvements in efficiency can lead to a reduced amplifier cost (e.g. by allowing for the use of less expensive transistors with reduced power handling capability) and reduced operating expense (e.g. reduced size, reduced cooling requirements, reduced power requirements, etc.). Typically, amplifier linearity is sacrificed in order to obtain increased efficiency. Linearity is the ability of an amplifier to deliver an output signal in exact proportion (the gain factor of the amplifier) to the input signal. When linearity is sacrificed at the expense of efficiency, the output signal of the amplifier is not delivered in exact proportion to the input signal.

One technique for compensating for non-linearity in an amplifier, or any other non-linear element, is referred to as predistortion. In predistortion techniques, a non-linear distortion is applied to an input signal before the input signal is applied to the non-linear element, such that the non-linear distortion that is applied, i.e., the "predistortion", compensates to some degree for the non-linear behaviour of the non-linear element. In order to satisfy regulatory emission requirements, the non-linearity of non-linear elements in a communications system often requires some form of linearization, as linearity often indirectly impacts one or more regulatory criterion. Accordingly, predistortion or some other linearization technique is often utilized so that regulatory emission requirements can be achieved even though linearity itself may not be an explicit or direct criterion of the regulatory emission requirement.

One predistortion technique employed today is referred to as baseband digital predistortion. In systems exhibiting "memory" (i.e., nonlinear behaviour that is a function of past inputs), a Volterra series based mechanism (or subset) is often used as a means of generating the required baseband predistortion. However, the corresponding hardware realization of the predistorter can be resource intensive.

A typical "memory polynomial" predistorter uses an actuator described by the equation:

$$y(n) = \sum_{k=0}^{K} \sum_{q=0}^{Q} \varphi_{k,q} x(n-q) |x(n-q)|^k, \quad (1.1)$$

where K and Q are implementation specific design parameters, which determine the number of branches (K+1) of the actuator and the number of previous samples or "memory" (Q+1) that are included in the predistortion compensation, respectively, and $\varphi$ is a matrix of coefficients that determines the non-linear predistortion implemented by the predistorter.

Note that Eqn. 1.1 represents only a subset of the terms contained in a full Volterra series.

FIG. 1 is a block diagram of a conventional memory polynomial predistorter 100 that implements the Eqn. 1.1.

In FIG. 1, the conventional memory polynomial predistorter 100 includes K+1 branches, Branch 0 to Branch K, each having a respective FIR (Finite Impulse Response) filter, 104-0 to 104-K and a respective power term block 102-0 to 102-K, i.e., $x(n), x(n)|x(n)|, x(n)|x(n)|^2, \ldots, x(n)|x(n)|^K$, in order to implement the K+1 basis functions defined by Eqn. 1.1. K dual input adders 112-0 to 112-(K−1) sum the outputs of the K+1 branches (only dual input adders 112-0 and 112-1 are shown in FIG. 1).

The FIR filter 104-0 in the first branch of the predistorter 100 is shown in detail in FIG. 1. The FIR filter 104-0 is an order Q FIR filter that includes Q delay elements 106-1 to 106-Q, Q+1 multipliers 108-0 to 108-Q and an adder 110.

In operation, a digital input x(n) is processed by each of the K+1 branches in parallel and outputs of the branches are summed by the K dual input adders 112-0 to 112-(K−1). For example, with reference to the first branch, the first branch is a power zero, or linear branch, so the power block 102-0 simply passes the input x(n) to the FIR filter 104-0 of the first branch. The Q delay elements 106-1 to 106-Q sequentially delay the output of the first power block 102-0. The input of the FIR filter 104-0 and the sequentially delayed outputs of the Q delay elements 106-1 to 106-Q are each tapped off and multiplied by a respective coefficient $\phi_{0,0}$ to $\phi_{0,Q}$ using the multipliers 108-0 to 108-Q, respectively. Outputs of the multipliers 108-0 to 108-Q are summed by the adder 110 and passed to the first dual input adder 112-0.

While the adder 110 is shown as a single element in FIG. 1, in some cases the functionality of the adder 110 is realized with a plurality of adders arranged to collectively sum the outputs of the Q+1 multipliers 108-0 to 108-1. For example, in some cases the adder 110 may be realized by Q dual-input adders arranged to collectively sum the outputs of the Q+1 multipliers 108-0 to 108-Q. More generally, any number of functional elements arranged in any configuration that serves to sum the outputs of the Q+1 multipliers 108-0 to 108-Q for each sample period of the digital input signal may be used.

The power blocks 102-1 to 102-K and the FIR filters 104-1 to 104-K in the other branches operate in a similar manner to the power block 102-0 and the FIR filter 104-0 in the first branch, although the power blocks 102-1 to 102-K multiply the input signal x(n) by its magnitude raised to successively higher powers and each branch utilizes a separate set of Q+1 coefficients $\phi_{k,0}$ to $\phi_{k,Q}$, where k is an integer corresponding to the power to which the magnitude of the input signal x(n) is raised in the power term block for the respective branch. Accordingly, the predistorter 100 includes a total of (K+1)*(Q+1) coefficients $\phi_{0,0}$ to $\phi_{K,Q}$.

In some cases the conventional actuator may be supplemented with additional "cross-terms" (i.e. constituent terms have a time difference and/or have multiple power terms) from the full Volterra series.

A traditional memory polynomial predistorter, such as the one illustrated in FIG. 1, uses "power terms" (e.g. the $|x(n)|^2$ function included in the power term block 102-2) in each of its branches as its basis functions. The large variation in the values between the outputs of these power terms typically leads to predistorter coefficients $\phi$ with high dynamic range requirements (i.e. require a large number of bits to be able to represent both the minimum and maximum value).

An example of the output magnitudes 400, 402, 404, 406 and 408 of the basis functions of a fifth order memory polynomial predistorter, such as the memory polynomial predistorter 100 of FIG. 1, is shown in FIG. 4. The resulting coefficients when using "power term" basis functions in conventional memory polynomial predistorters typically require a large dynamic range, as demonstrated by the ratio of the magnitude of the output of the first order basis function, i.e., $|x(n)|$, to the magnitude of the output of the fifth order basis function, i.e., $|x(n)|^5$, which, for example, at a normalized input magnitude of 0.25 is $0.25/0.25^5 = 256$ in FIG. 4. This high ratio between the magnitudes of the outputs of the first order basis function and the fifth order basis function means that if the conventional memory polynomial predistorter is to be used to correct for a non-linearity that includes a strong fifth order component the magnitude of the Q+1 coefficients $\phi_{5,0}$ to $\phi_{5,Q}$ in the fifth order branch of the predistorter are large, i.e. the coefficients potentially have a large dynamic range requiring a large number of bits, in order to weight the output of the fifth order power term block 102-4 (not explicitly shown in FIG. 1) so that the magnitude of the fifth order predistortion output of the filter 104-4 (not explicitly shown in FIG. 1) in the fifth order branch of the predistorter is sufficiently large enough to provide the desired fifth order predistortion.

The large number of bits required to be able to represent both the minimum and maximum value of the outputs of the power term blocks 102-0 to 102-K and the coefficients $\phi_{0,0}$ to $\phi_{K,Q}$ in the branches of the predistorter actuator 100 leads to increased computational cost in the corresponding hardware realization of the constituent arithmetic units (e.g. multipliers 108-0 to 108-Q, adders 110 and 112-0 to 112-(K−1), accumulators (not shown)). However, simply reducing the number of bits used through, for example, direct quantization may result in reduced system performance since the accuracy of the predistortion may be reduced by the direct quantization.

In an attempt to improve the performance of conventional memory correction predistortion systems, in some prior art systems multiple sets of coefficients $\phi$ have been defined, with each distinct set of coefficients referred to as a "section". The bounds of the operating region of each section correspond to values of the magnitude of the input signal. For example, the section number $\phi$ may be determined in accordance with $$\text{lowerSecVal}(\phi) \leq |x(n)| < \text{upperSecVal}(\phi), \quad (1.2)$$

where lowerSecVal and upperSecVal are vectors that define the lower and upper bounds of each section, respectively. A possible realization of a predistortion actuator 200 that implements this conventional sectioning scheme is shown schematically in FIG. 2.

The predistortion actuator 200 shown in FIG. 2 includes a magnitude detector 202, a section determination block 206, a plurality of K+1 branches, branch 0 to branch K, and a plurality of K adders, 212-0 to 212-(K−1). Each branch includes a respective FIR Filter 210-0 to 210-K. In FIG. 2, the FIR filters 210-0 to 210-K are each implemented as an order Q FIR filter, which means that each FIR filter 210-0 to 210-K includes Q+1 taps. Branches 1 to K each include a respective multiplier 208-1 to 208-K. Branches 2 to K each further include a respective power term block 204-1 to 204-(K−1).

The magnitude detector 202 is connected to an input of the predistortion actuator to receive a predistorter input signal $x(n)$. The predistorter input also provides the predistorter input signal $x(n)$ to the FIR Filter 210-0 in branch 0 and to each of the K multipliers 208-1 to 208-K. The magnitude detector 202 provides a magnitude output $|x(n)|$ corresponding to the magnitude of the predistorter input signal $x(n)$ to the multiplier 208-1 in branch 1 and to each of the power term blocks 204-1 to 204-(K−1) in branches 2 to K, respectively. The respective power term block 204-1 to 204-(K−1) of branches 2 to K respectively raise the magnitude output $|x(n)|$ they receive from the magnitude detector 202 to successively higher orders of power corresponding to their respective branch number, i.e. the power term block 204-1 in branch 2 squares the magnitude signal $|x(n)|$ it receives from the magnitude detector 202. The respective outputs of the power term blocks 204-1 to 204-(K−1) are provided to multipliers 208-2 to 208-K. The K multipliers 208-1 to 208-K multiply their respective inputs together and provide the respective multiplied results to the FIR Filters 210-1 to 210-K. The plurality of K adders 212-0 to 212-(K−1) sum the outputs of the K+1 FIR Filters 210-0 to 210-K to produce a predistorted output signal $y(n)$.

The section determination block 206 monitors the magnitude output $|x(n)|$ of the magnitude detector 202 to determine which section number $\phi$ the current input sample belongs to according to Eqn. 1.2, and adjusts branch coefficients $\phi_{0,0}$ to $\phi_{K,Q}$ in the K+1 FIR Filters 210-0 to 210-K of each branch of the actuator according to the determined section number $\phi$.

In this way, the coefficients of the constituent FIR filters 210-0 to 210-K may be changed at each sample period n responsive to the instantaneous magnitude of the input signal $x(n)$.

A graphical example of how coefficient sectioning subdivides the predistortion characteristic is given in FIG. 3. FIG. 3 is a plot of output envelope amplitude versus input envelope amplitude for a predistortion actuator using a sectioning scheme where the input envelope amplitude is sectioned into a plurality of 15 sections 300-1 to 300-15 respectively representing an input envelope value range, such as the one defined in Eqn. 1.2.

The use of coefficient sectioning in a predistortion actuator has a number of impacts on a memory correction predistortion system incorporating the predistortion actuator. Examples of those impacts may include:

1. the predistortion actuator must be capable of completely changing its coefficient values every input sample period according to the predetermined criteria (e.g. input envelope amplitude);

2. additional logic is required to determine which section corresponds to the input envelope amplitude of a current input sample of the input signal $x(n)$;

3. additional memory storage is required for each section, as training is required to generate coefficients for each section to generate the desired predistortion; and 4. the training algorithm must be applied to each section, thereby increasing the overall computational requirement for the training algorithm.

While coefficient sectioning typically provides a performance improvement over global, i.e., non-sectioned, coefficient polynomial memory correction predistorters, the performance improvement comes with a further increase in hardware and computational costs.

SUMMARY OF THE INVENTION

An architecture for memory polynomial based memory correction and linearization is provided, in which the underlying non-linear basis functions are sectioned into a number of smaller sets defined over a specific range of one or more input signal characteristics, such as the magnitude of the input signal and/or a temporal characteristic of the input signal relative to some time marker or reference, for example, a number of sample periods following a synchronization marker in a TDD (Time Domain Duplexing) system, such as WiMAX. The non-linear basis function sections are constructed such that the difference between basis functions is kept small, which tends to reduce dynamic range of resulting coefficients.

In some embodiments, the coefficient training process is modified to further reduce coefficient dynamic range by, for example, controlling the quantization levels of the training signals to avoid emphasizing of "don't care" regions, e.g., training signals with extremely low power levels.

In some embodiments, a hybrid approach is taken in which some of the branches of the predistortion actuator utilize global, i.e., non-sectioned, basis functions, typically the branches for lower ordered polynomial power terms, and at least one branch utilizes a sectioned basis function.

Embodiments of the invention may facilitate a hardware efficient realization by potentially reducing the hardware resource requirements with only a minor effect on correction performance.

According to one broad aspect, the present invention provides a predistortion actuator for predistorting a digital input signal, the predistortion actuator comprising: a plurality of branches that each implement a respective basis function, wherein for each of at least one of the plurality of branches, the respective basis function is a sectioned basis function having a respective distinct definition for each section of a respective plurality of sections, the respective plurality of sections defining a range of at least one input signal characteristic associated with the digital input signal.

In some embodiments, the at least one of the plurality of branches comprises all of the plurality of branches.

In some embodiments, the respective plurality of sections is the same for each of the plurality of branches.

In some embodiments, the at least one input signal characteristic comprises magnitude of the digital input signal, such that each sectioned basis function has a respective distinct definition for each section of a respective plurality of sections defining a magnitude range of the digital input signal.

In some embodiments, the at least one input signal characteristic comprises a temporal characteristic of the digital input signal, such that each sectioned basis function has a respective distinct definition for each section of a respective plurality of sections defining a time period relative to some time marker associated with the digital input signal.

In some embodiments, the at least one input signal characteristic comprises a temporal characteristic of the digital input signal and magnitude of the digital input signal, such that each sectioned basis function has a respective distinct definition for each section of a plurality of sections defining both:

a) a time period relative to some time marker associated with the digital input signal; and b) a magnitude range of the digital input signal.

In some embodiments, each section of the respective plurality of sections defining the time period associated with the digital signal corresponds to a respective number of sample periods of the digital input signal.

In some embodiments, each sectioned basis function comprises a normalization factor that is held constant across each of the respective plurality of sections.

In some embodiments, each sectioned basis function comprises a normalization factor that varies on at least one of: a per section basis; and a per branch basis.

In some embodiments, each sectioned basis function is implemented according to:

$$f_k(x(n),\phi)=x(n)(\text{normEnv}(x(n),\phi)^k(\text{upperSecVal}(\phi)-\text{lowerSecVal}(\phi))+\text{lowerSecVal}(\phi))s\text{Fact}(k,\phi),$$

where $$\text{normEnv}(x(n), \phi) = \frac{|x(n)| - \text{lowerSecVal}(\phi)}{\text{upperSecVal}(\phi) - \text{lowerSecVal}(\phi)},$$

where k is a branch number, x(n) is the input signal, $\phi$ is a section number that is determined in accordance with $$\text{lowerSecVal}(\phi) \leq |x(n)| < \text{upperSecVal}(\phi),$$

where lowerSecVal and upperSecVal are vectors that define the lower and upper boundaries of each section, respectively, and sFact(k,$\phi$) is a normalization factor defined for each actuator branch k of the plurality of branches and section $\phi$ of the plurality of sections independently.

In some embodiments, for each sectioned basis function, the normalization factor sFact(k,$\phi$) is constant across the respective plurality of sections.

In some embodiments, the normalization factor sFact(k,$\phi$) is determined according to:

$$sFact(k, \phi) = \frac{1}{\max(\text{upperSecVal}(\phi))},$$

where max(upperSecVal($\phi$)) is the maximum upper section value of the vector of upper section values upperSecVal($\phi$) for all branches k and sections $\phi$.

In some embodiments, the normalization factor sFact(k,$\phi$) is determined according to:

$$sFact(k, \phi) = \frac{1}{\text{upperSecVal}(\phi)}.$$

In some embodiments, for at least one of the sectioned basis functions, the section boundaries of the respective plurality of sections are adaptively adjusted.

In some embodiments, each branch of the plurality of branches comprises a Finite Impulse Response (FIR) filter arranged to respectively filter an output of the respective basis function of the respective branch.

In some embodiments, the predistortion actuator further comprises: a plurality of adders arranged to collectively add outputs of the FIR filters to generate a predistorted digital signal.

In some embodiments, operation of each FIR filter is based on a respective set of filter coefficients, the predistortion actuator further comprising a distinct set of coefficients for each of the plurality of sections for each of the FIR filters.

In some embodiments, the predistortion actuator further comprises a section determiner configured to: for each sample period of the digital input signal, determine a current section of the respective plurality of sections based on a current value of the at least one input signal characteristic of the digital input signal, and select a respective one of the distinct sets of coefficients for the respective FIR filter of each of the plurality of branches based on the current section.

In some embodiments, for each sectioned basis function: a respective set of coefficients for each section of the plurality of sections is determined using a coefficient training algorithm comprising training signal conditioning.

According to another broad aspect, the present invention provides a power amplifier system, comprising: a predistortion actuator according to the first broad aspect configured to predistort a baseband digital input signal to generate a predistorted baseband digital signal; an upconversion function configured to generate a predistorted radio frequency (RF) signal corresponding to the predistorted baseband digital signal; a predistortion actuator model configured to determine predistortion coefficients for each of the branches of the predistortion actuator, wherein the predistortion actuator predistorts the baseband digital input signal based on the predistortion coefficients; a power amplifier configured to amplify the predistorted RF signal to generate an RF output signal; and a downconversion function configured to generate a baseband digital output signal corresponding to the RF output signal, wherein the predistortion actuator model determines the predistortion coefficients for each of the branches of the predistortion actuator based on the baseband digital output signal and the predistorted baseband digital signal.

In some embodiments, each sectioned basis function comprises a normalization factor that varies on at least one of: a per section basis; and a per branch basis.

Other aspects and features of the present invention will become apparent, to those ordinarily skilled in the art, upon review of the following description of the specific embodiments of the invention.

BRIEF DESCRIPTION OF THE DRAWINGS

Embodiments of the invention will now be described in greater detail with reference to the accompanying drawings, in which:

FIG. 14 is a table summarizing the comparative performance of a few very specific examples of conventional global basis function based predistortion actuators and the sectioned basis function based and hybrid basis function based predistortion actuators in accordance with particular embodiments of the present invention corresponding to the results illustrated in FIG. 13.

DETAILED DESCRIPTION

In the following detailed description of sample embodiments, reference is made to the accompanying drawings, which form a part hereof, and in which is shown by way of illustration specific sample embodiments in which the present invention may be practised. These embodiments are described in sufficient detail to enable those skilled in the art to practice the invention, and it is to be understood that other embodiments may be utilized and that logical, mechanical, electrical, and other changes may be made without departing from the scope of the invention. The following detailed description is, therefore, not to be taken in a limiting sense, and the scope is defined by the appended claims.

One challenge in the development of memory correction predistortion systems is the realization of the predistortion actuator in a hardware efficient manner. Typically, the coefficients associated with a memory correction predistortion actuator:

- have a large dynamic range which requires large wordlengths for the arithmetic units that make up the actuator (increasing size and cost), or
- have a reduced dynamic range achieved by increasing the complexity of the coefficient calculation algorithm, e.g. by utilizing bounded coefficient value ranges (which also may reduce the achievable correction performance).

In order to address the dynamic range effects inherent in the use of a conventional global basis function based predistortion actuator, embodiments of the present invention provide an architecture in which the underlying basis functions change on a per section basis.

In some embodiments, both the underlying basis functions and the coefficient values change on a per section basis.

Figure 5:
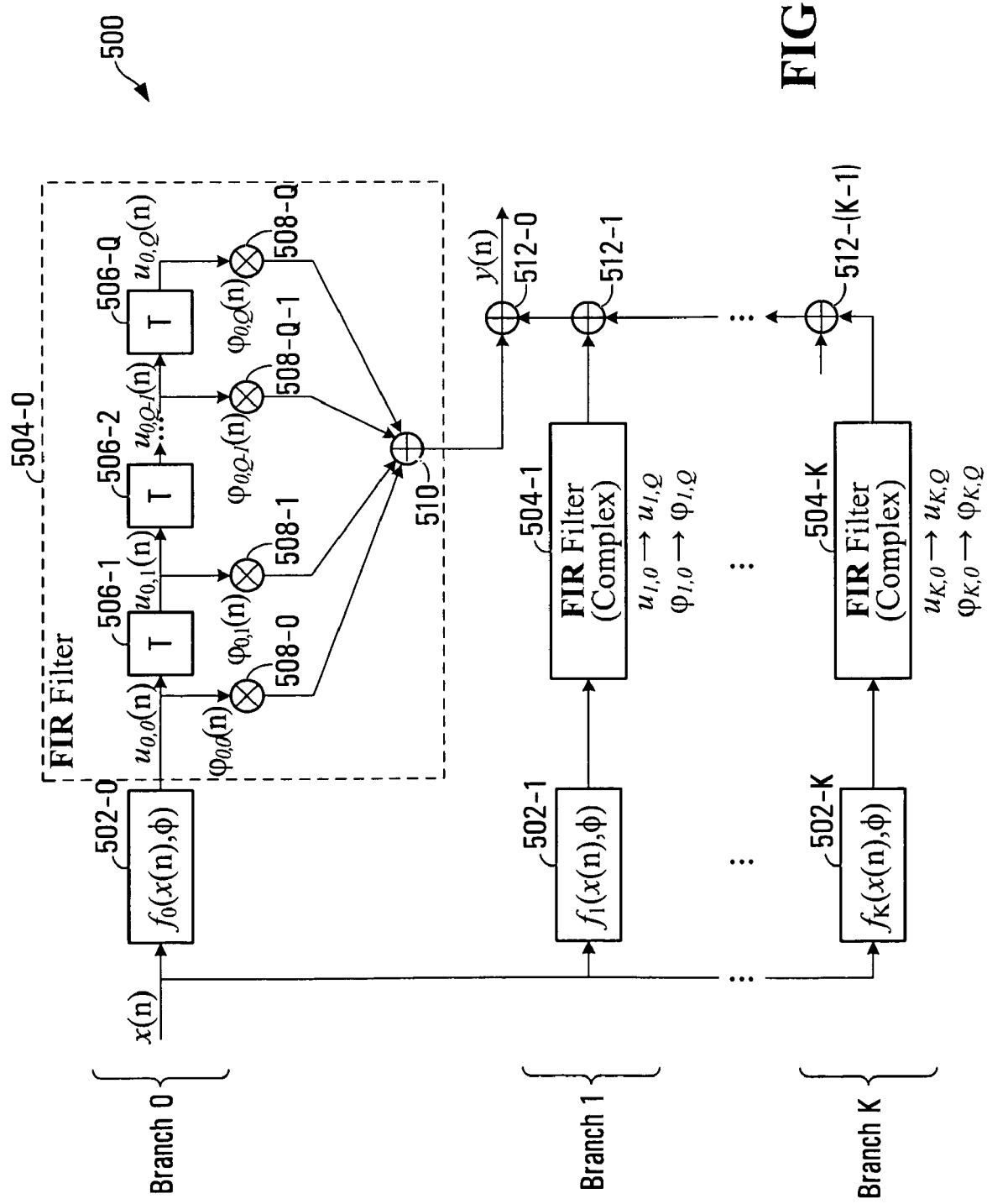
FIG. 5 is a diagram illustrating a predistortion actuator with sectioned basis functions in accordance with an embodiment of the present invention.

FIG. 5 is a schematic diagram illustrating a predistortion actuator 500 with sectioned basis functions and coefficient values in accordance with an embodiment of the present invention. In FIG. 5, the predistortion actuator 500 includes K+1 branches Branch 0 to Branch K (only Branches 0, 1 and K are explicitly shown in FIG. 5) for a set of K+1 sectioned basis functions, where each branch includes a FIR filter 504-0 to 504-K, respectively, and a sectioned basis function block $f_k(x(n),\phi)$ 502-0 to 502-K, respectively, where x(n) is the digital input signal, $\phi$ is the section number and k is the branch number.

A sectioned basis function block, such as the sectioned basis function blocks 502-0 to 502-K in FIG. 5, are function blocks that implement sectioned basis functions that have distinct definitions of the function for each of a plurality of sections that each define a respective range of at least one input signal characteristic of the digital input signal, for example, a physical characteristic, such as bounded magnitude ranges of the digital input signal, and/or a temporal characteristic, such as a number of sample periods of the digital input signal relative to some time marker or reference. That is, the sectioned basis function has a distinct definition over distinct ranges of one or more input signal characteristics of the digital input signal, where the distinct ranges of the input signal characteristic(s) define the sections of the sectioned basis function.

The predistortion actuator 500 further includes a plurality of K dual input adders 512-0 to 512-(K−1) that collectively sum the outputs of the K+1 FIR filters 504-0 to 504-K of the K+1 branches, Branch 0 to Branch K, to generate a predistorted digital output signal y(n). While K dual input adders 512-0 to 512-(k−1) are arranged to collectively sum the outputs of the K+1 branches in the embodiment shown in FIG. 5, more generally, any number of functional elements arranged in any configuration that serves to sum the outputs of the K+1 branches for each sample period of the digital input signal may be used.

Figure 1:
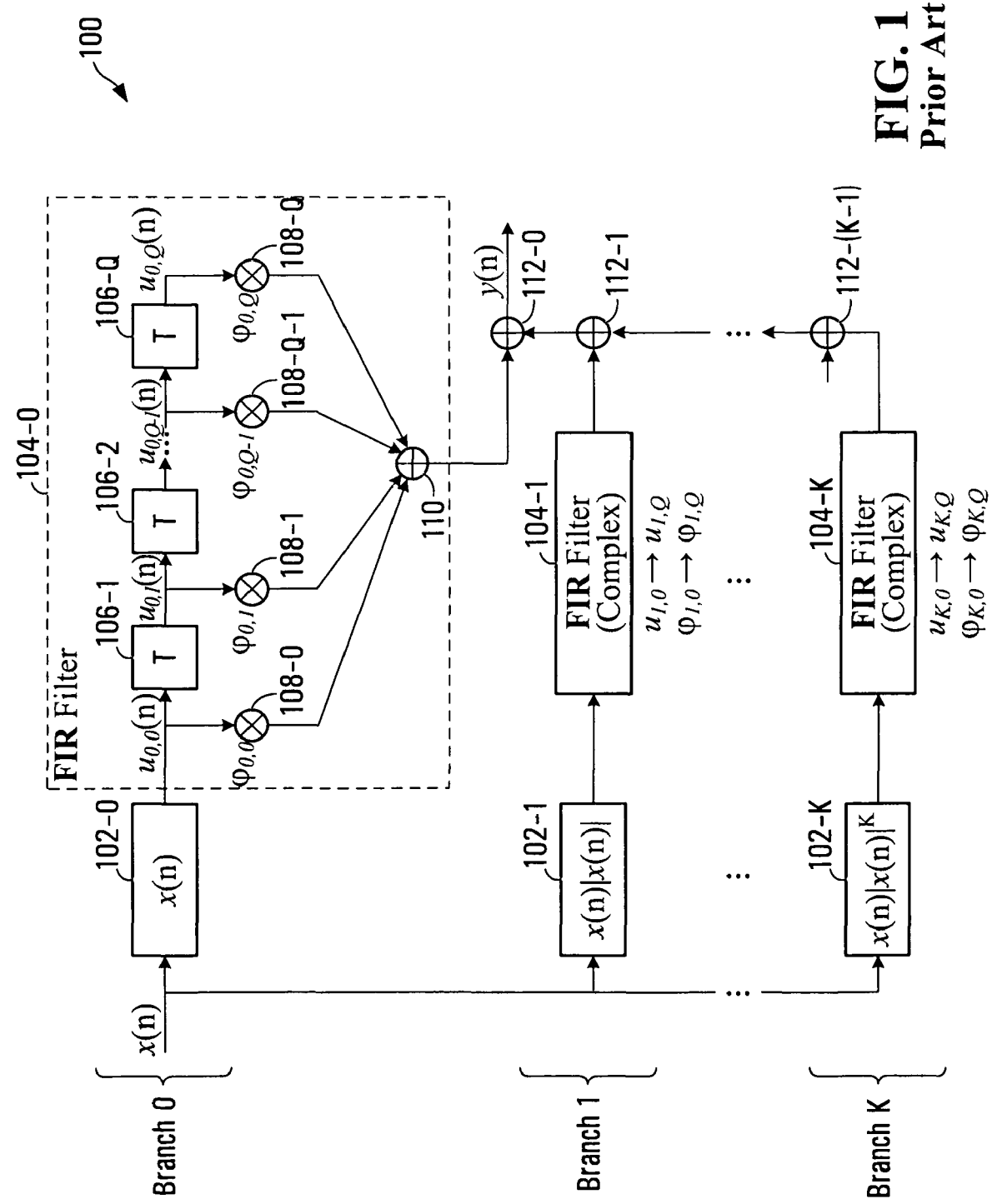
FIG. 1 is a diagram illustrating a conventional predistortion actuator.

The constituent processing elements of the FIR filter 504-0 in the first branch, Branch 0, are shown in FIG. 5. The constituent processing elements of the other FIR filters 504-1 to 504-K in the other branches, Branch 1 to Branch K, are not shown, but it should be understood that they are similar to that of the first FIR filter. Similar to the FIR filter 104-0 shown in FIG. 1, the FIR filter 504-0 shown in FIG. 5 includes Q delay elements 506-1 to 506-Q, Q+1 multipliers 508-0 to 508-Q and an adder 510.

In operation, a digital input signal x(n) is processed by each of the K+1 branches in parallel and outputs of the branches are summed by the K dual input adders 512-0 to 512-(K−1). For example, with reference to the first branch, for each sample period, the first sectioned basis function block 502-0 determines the output of the first sectioned basis function $f_0(x(n),\phi)$ as a function of the digital input signal x(n) and the section number $\phi$ corresponding to a range into which the digital input signal x(n) falls.

The Q delay elements 506-1 to 506-Q of the FIR filter 504-0 sequentially delay the output of the first sectioned basis function block 502-0. The input of the FIR filter 504-0 and the sequentially delayed outputs of the Q delay elements 506-1 to 506-Q are each tapped off and multiplied by a respective coefficient $\phi_{0,0}(n)$ to $\phi_{0,Q}(n)$ using the multipliers 508-0 to 508-Q, respectively. Outputs of the multipliers 508-0 to 508-Q are summed by the adder 510 and passed to the first dual input adder 512-0.

While the adder 510 is shown as a single element in FIG. 5, in some embodiments the functionality of the adder 510 is realized by a plurality of adders arranged to collectively sum the outputs of the Q+1 multipliers 508-0 to 508-Q. For example, in some cases the adder 510 may be realized by Q dual-input adders arranged to collectively sum the outputs of the Q+1 multipliers 508-0 to 508-Q. More generally, any number of functional elements arranged in any configuration that serves to sum the outputs of the Q+1 multipliers 508-0 to 508-Q for each sample period of the digital input signal x(n) may be used.

In some embodiments, the coefficients $\phi_{0,0}(n)$ to $\phi_0,Q(n)$ of the FIR filter 504-0 are section-dependent, i.e., sectioned coefficients.

The sectioned basis function blocks 502-1 to 502-K and the FIR filters 504-1 to 504-K in the other branches operate in a similar manner to the first sectioned basis function block 502-0 and the FIR filter 504-0 in the first branch, Branch $\phi$, although the sectioned basis function blocks 502-1 to 502-K implement a different sectioned basis function, $f_1(x(n),\phi)$ to $f_K(x(n),\phi)$, and each branch utilizes a separate set of Q+1 coefficients $\phi_{k,0}$ to $\phi_{k,Q}$, where k is an integer corresponding to the branch number. Accordingly, the sectioned basis function based predistorter 500 illustrated in FIG. 5 includes a total of (K+1)*(Q+1) coefficients $\phi_{0,0}$ to $\phi_{K,Q}$.

In some embodiments with sectioned coefficients, the sectioned basis function based predistorter 500 illustrated in FIG. 5 includes a total number of coefficients equal to (K+1)*(Q+1)*the number of sections, i.e., (K+1)*(Q+1) coefficients for each section.

The use of sectioned basis functions $f_0(x(n),\phi)$ to $f_K(x(n),\phi)$ allows the basis functions to be defined such that the relative differences between basis functions is reduced, while at the same time, potentially reducing the impact on correction/linearization performance that may result from direct quantization techniques, or conventional coefficient sectioning techniques, in global basis function based predistortion actuators.

One sectioned basis function set that is used in some embodiments of the present invention is given by:

$$f_k(x(n),\phi) = x(n)(\text{normEnv}(x(n),\phi)^k(\text{upperSecVal}(\phi) - \text{lowerSecVal}(\phi)) + \text{lowerSecVal}(\phi))s\text{Fact}(k,\phi), \quad (2.1)$$

where $$\text{normEnv}(x(n), \phi) = \frac{|x(n)| - \text{lowerSecVal}(\phi)}{\text{upperSecVal}(\phi) - \text{lowerSecVal}(\phi)}, \quad (2.2)$$

and where sFact(k,$\phi$) is a normalization factor that includes a matrix of constant values defined for each actuator branch k and section $\phi$ independently.

In some embodiments, sFact(k,$\phi$) is held constant across the sections of the sectioned basis functions, i.e., a global normalization factor. In some of those embodiments, sFact(k,$\phi$) is determined according to:

$$s\text{Fact}(k, \phi) = \frac{1}{\max(\text{upperSecVal}(\phi))}, \text{ for all } k, \phi, \quad (2.3)$$

where max(upperSecVal($\phi$)) is the maximum upper section value of the vector of upper section values upperSecVal($\phi$) for all branches k and sections $\phi$.

In some embodiments, sFact(k,$\phi$) is varied on a per section basis. In some of those embodiments, sFact(k,$\phi$) is determined according to:

$$s\text{Fact}(k, \phi) = \frac{1}{\text{upperSecVal}(\phi)}, \quad (2.4)$$

i.e., for each section sFact(k,$\phi$) is set to the upper section value for that section.

Figure 6:
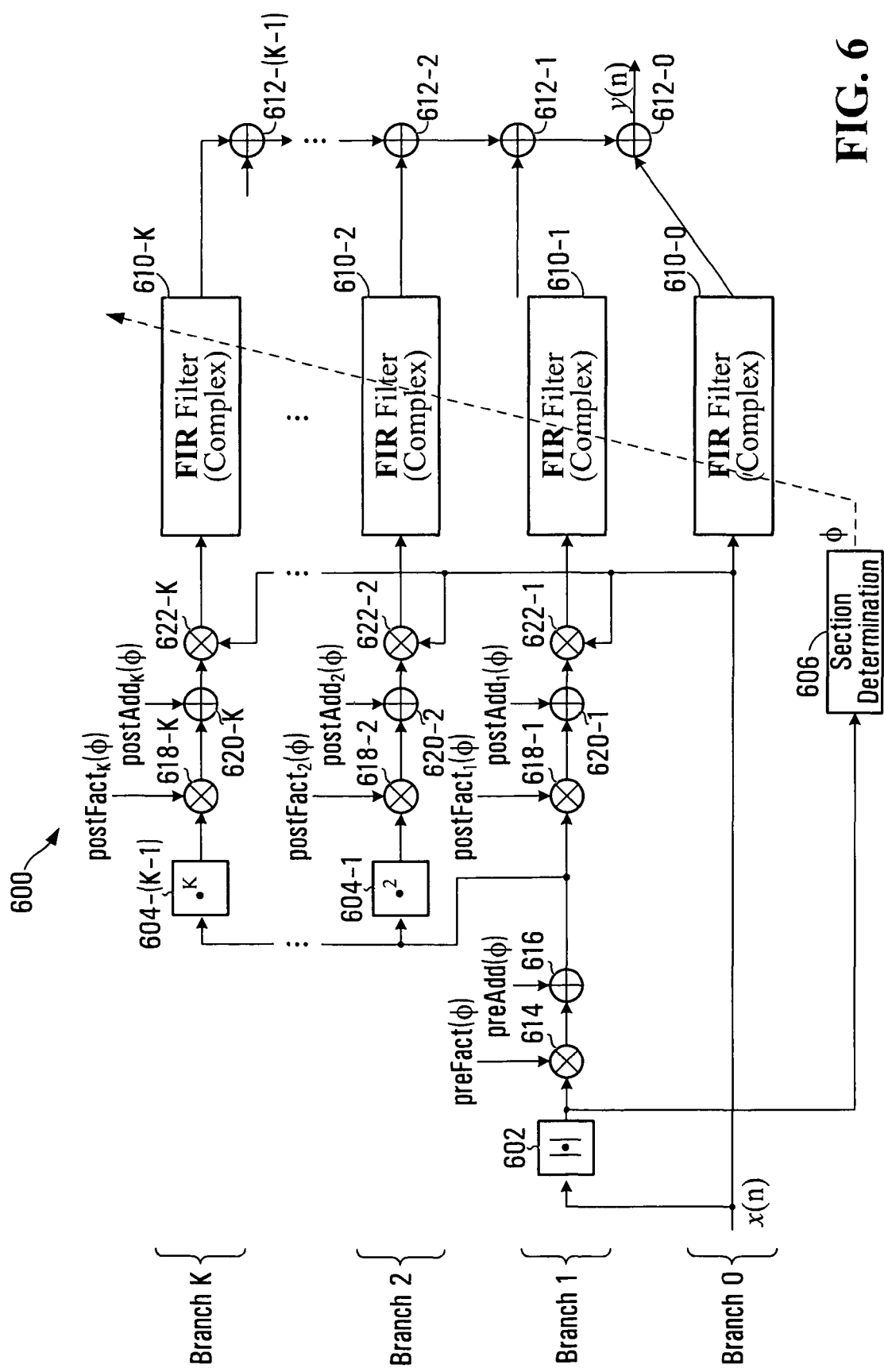
FIG. 6 is a schematic implementation of a predistortion actuator with sectioned basis functions in accordance with an embodiment of the present invention.

One possible realization for this type of actuator is shown schematically in FIG. 6.

FIG. 6 is a schematic diagram of a sectioned basis function based predistortion actuator 600 that includes a magnitude detector 602 having an input connected to an input of the predistortion actuator to receive a digital input signal x(n), a first multiplier 614 having a first input connected to an output of the magnitude detector 602, a first adder 616 having a first input connected to an output of the first multiplier 614, a section determination block 606 having an input connected to the output of the magnitude detector 602, a plurality of K+1 branches, branches 0 to K, and a plurality of K output adders, 612-0 to 612-(K−1) arranged to collectively add outputs of the K+1 branches to generate a predistorted digital output signal y(n).

Branches 2 to K each include a respective power term block 604-1 to 604-(K−1) each implementing a power function corresponding to its respective branch number and having an input connected to an output of the first adder 616.

Branches 1 to K each include a first respective multiplier 618-1 to 618-K, a respective adder 620-1 to 620-K having a first input connected to an output of the first respective multiplier, and a second respective multiplier 622-1 to 622-K having a first input connected to an output of the respective adder 620-1 to 620-K.

In Branch 0, an input of the FIR filter 610-0 is connected to the predistorter input to receive the digital input signal x(n).

In Branches 1 to K, a second input of the second respective multiplier 622-1 to 622-K for each branch is connected to the predistorter input to receive the digital input signal x(n) and inputs of the FIR filters 610-1 to 610-K are respectively connected to outputs of the second respective multipliers 622-1 to 622-K.

In Branch 1, the first respective multiplier 618-1 has an input connected to the output of the first adder 616.

In Branches 2 to K, the first respective multiplier 618-2 to 618-K for each branch has an input connected to an output of the respective power term block 604-1 to 604-(K−1) of that branch.

The power term blocks 604-1 to 604-K in FIG. 6 perform power functions on the output of the first adder 616. Accordingly, although an explicit power term block is not included in Branches 0 and 1 of the predistortion actuator 600, it should be appreciated that the connection between the output of the first adder 616 and the input of the first respective multiplier 618-1 in Branch 1 could be considered an order 1 power term block, since C=c.

The section determination block 606 is connected to an input on each of the K+1 FIR filters 610-0 to 610-K.

Note that in FIG. 6 several constants have been defined in order to simplify the design. Section specific constants preFact($\phi$) and preAdd($\phi$) are provided to second inputs of the first multiplier 614 and the first adder 616, respectively. Section and Branch specific constants postFact$_k$($\phi$) and postAdd$_k$($\phi$) are provided to second inputs of the first respective multiplier 618-$k$ and the respective adder 622-$k$ for Branches 1 to K, where k corresponds to the branch number.

The constants in FIG. 6 are defined in accordance with:

$$preFact(\phi) = \frac{1}{upperSecVal(\phi) - lowerSecVal(\phi)}, \quad (2.5)$$

$$preAdd(\phi) = -lowerSecVal(\phi) \times preFact(\phi), \quad (2.6)$$

$$postFact_k(\phi) = (upperSecVal(\phi) - lowerSecVal(\phi))sFact(k, \phi), \quad (2.7)$$

and $$postAdd_k(\phi) = lowerSecVal(\phi) \times sFact(k, \phi). \quad (2.8)$$

These constants can be pre-calculated and stored in memory. Furthermore, they can potentially be realized with variable shifts and low resolution multipliers as opposed to full-precision multipliers, thereby potentially reducing the hardware resources utilized for predistortion.

In operation, the magnitude detector 602 provides a magnitude output |x(n)| corresponding to the magnitude of the predistorter digital input signal x(n) to the first multiplier 614 and to the section determination block 606. The section determination block 606 determines the section number $\phi$ that the magnitude |x(n)| belongs to, for example, using Eqn. (1.2).

The determined section number $\phi$ may then be used to adjust the coefficients $\phi_{0,0}$ to $\phi_{K,Q}$ of the K+1 FIR filters 610-0 to 610-K. The determined section is also used to determine the values of the above-identified constants preFact($\phi$), preAdd($\phi$), postFact$_k$($\phi$) and postAdd$_k$($\phi$) according to Eqns. 2.5, 2.6, 2.7 and 2.8 provided above.

The first multiplier 614 multiplies the magnitude output |x(n)| of the magnitude detector 602 by the section specific constant preFact($\phi$). The first adder 616 adds the output of the first multiplier 614 together with the section specific constant preAdd($\phi$).

The respective power term block 204-$k$ of branches 2 to K respectively perform a power function corresponding to their respective branch number on their respective inputs from the first adder 616, i.e. the power term block 604-1 in branch 2 squares the input it receives from the output of the first adder 616.

In Branch 1, the first respective multiplier 618-1 multiplies the output of the first adder 616 by the constant postFact$_1$($\phi$), the respective adder 620-1 adds the output of the first respective multiplier 618-1 together with the constant postAdd$_1$($\phi$) and the second respective multiplier 622-1 multiplies the output of the respective adder 620-1 by the digital input signal x(n). The FIR filter 610-1 processes the output of the second respective multiplier 622-1 according to the operation of a FIR filter described above with reference to the FIR filter 504-0 shown in FIG. 5. The operation of the first respective multiplier 618-$k$, the respective adder 620-$k$, the second respective multiplier 622-$k$ and the FIR filter 610-$k$, where k is the branch number, in Branches 2 to K is similar to that of the corresponding components in the first branch and therefore an additional explicit description of their operation is omitted for the sake of brevity.

The plurality of K output adders 612-0 to 612-(K−1) add the outputs of the K+1 FIR Filters 610-0 to 610-K to generate the predistorted digital output signal y(n).

Figure 2:
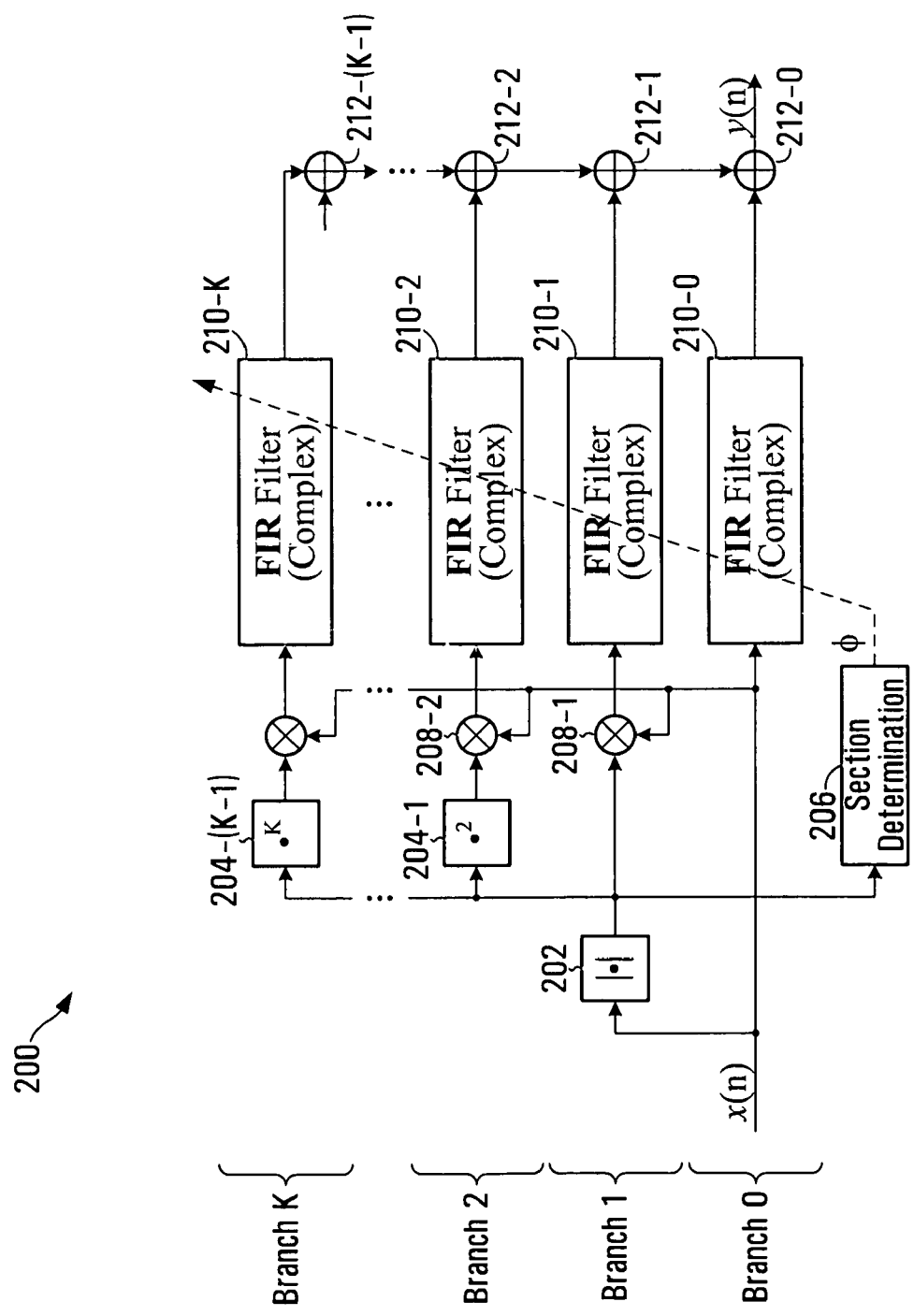
FIG. 2 is a schematic diagram of a conventional coefficient sectioned predistortion actuator.

The incremental hardware cost of a sectioned basis function based predistortion actuator, when comparing the sectioned basis function based predistortion actuator 600 in FIG. 6 to the conventional global basis function based predistortion actuator 200 in FIG. 2, is K+1 real multipliers (first multiplier 614 and K first respective multipliers 618-1 to 618-K) and K+1 real adders (first adder 616 and respective adders 620-1 to 620-K) located in the branches of the actuator before the FIR filters. This incremental cost will typically not be significant relative to the hardware savings in the realization of the complex FIR filters 610-0 to 610-K, which will usually contain an order of magnitude more real multipliers and adders. Accordingly, the potential reduction in the dynamic range requirements of the coefficients of the FIR filters, and the associated reduction in the number of bits of precision required in the adders and multipliers of the FIR filters, will more than offset the additional hardware costs of the adders and multipliers before the FIR filters.

Within the general context of Eqn. 2.1 and Eqn. 2.2, several different sets of sectioned basis functions can be obtained. For example, if the values of sFact(k,φ) are kept constant across sections and branches, then sectioned basis functions such as those illustrated in FIG. 7 can be obtained.

Figure 7:
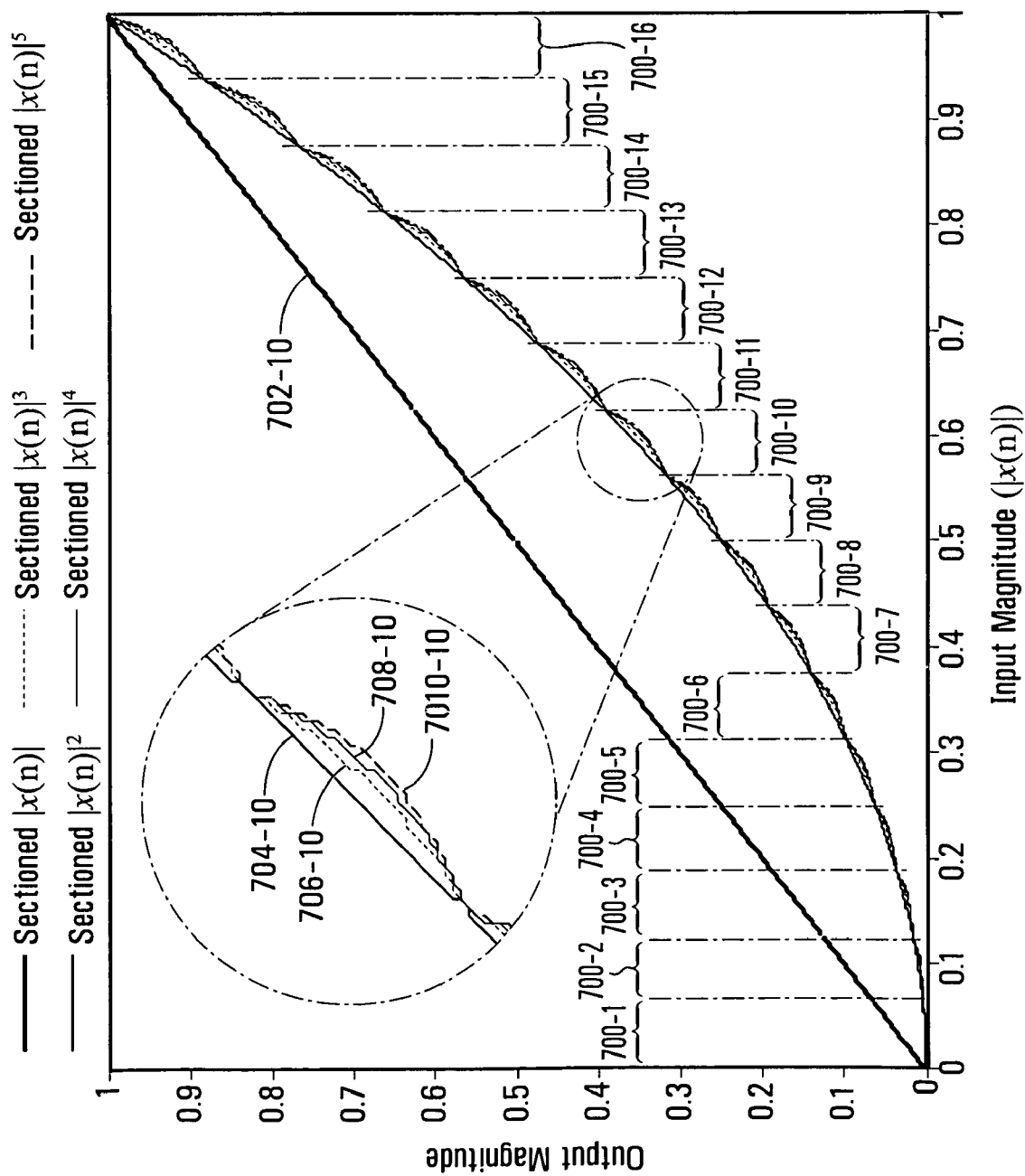
FIG. 7 is a plot of input magnitude vs. output magnitudes of the underlying sectioned basis functions of a predistortion actuator in accordance with an embodiment of the present invention, in which a normalization factor used to implement the sectioned basis function of each branch of the predistortion actuator is kept constant across sections and branches.

FIG. 7 is a plot of normalized sectioned basis function output magnitudes versus normalized input magnitudes |x(n)| in which the normalized input magnitude has been sectioned into 16 sections 700-1 to 700-16. The normalized output magnitudes of five section basis functions defined by Eqn. 2.1 and Eqn. 2.2 with sFact(k,φ) kept constant across all sections and branches are illustrated in FIG. 7. For example, section 700-10 includes sections 702-10, 704-10, 706-10, 708-10 and 810-10 of the first to fifth order normalized basis function outputs.

Figure 8:
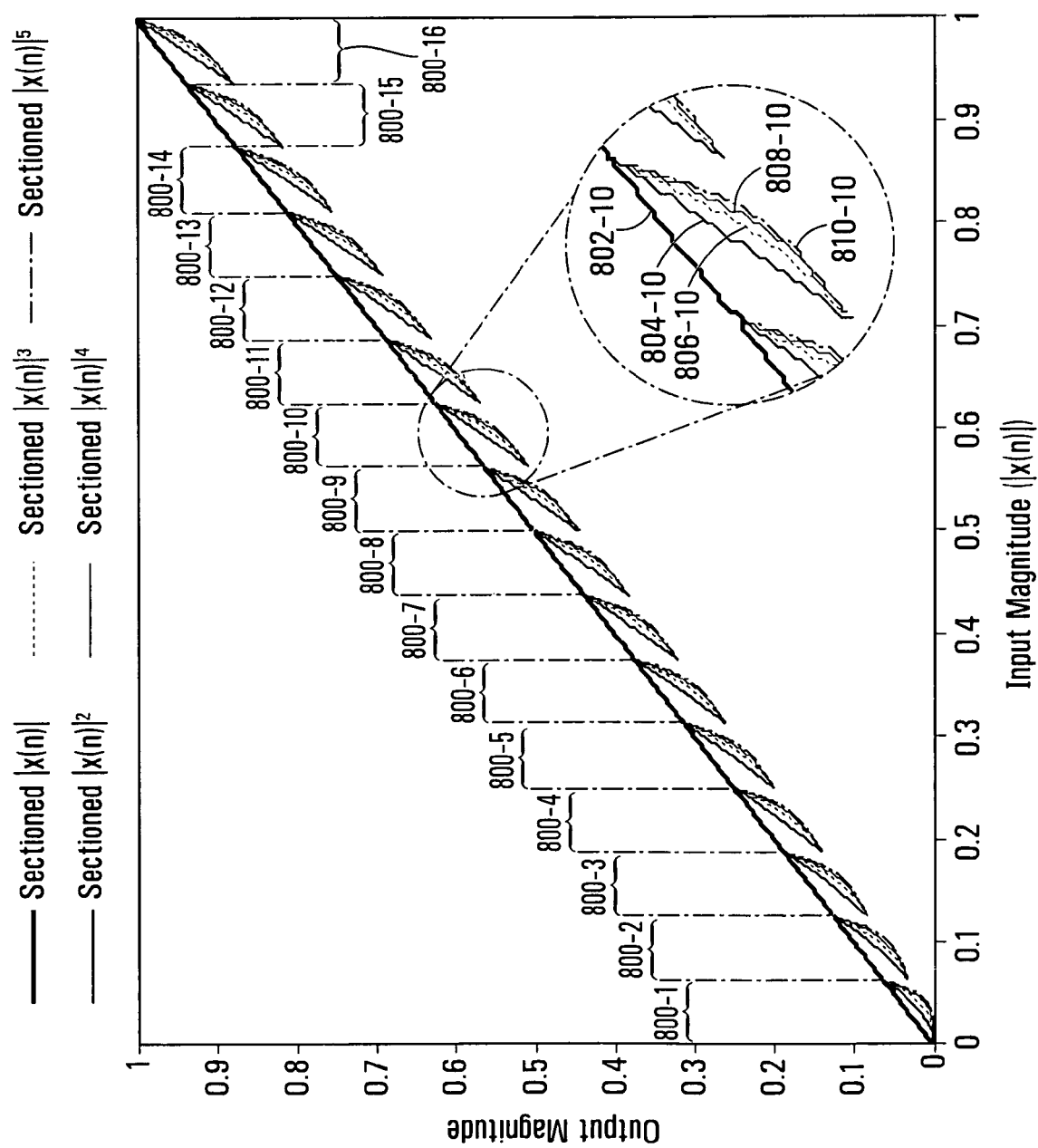
FIG. 8 is a plot of input magnitude vs. output magnitudes of the underlying sectioned basis functions of a predistortion actuator in accordance with another embodiment of the present invention, in which a normalization factor used to implement the sectioned basis function of each branch of the predistortion actuator is varied on a per section basis, but is kept constant across branches.

On the other hand, if the values of sFact(k,φ) are varied on a per section basis, but are kept constant across branches, then the resulting basis functions can be obtained as illustrated in FIG. 8. Similar to FIG. 7, the normalized input magnitude range is sectioned into 16 sections 800-1 to 800-16. However, varying sFact(k,φ) on a per section basis means that the sectioned basis functions can be effectively "normalized" for each section, so that the dynamic range between the output magnitude of the first order sectioned basis function 802-10 and the output magnitudes of the second through fifth order sectioned basis functions 804-10, 806-10, 808-10 and 810-10, respectively, in the tenth section 800-10 is reduced even further relative to the difference between the output magnitudes of the sectioned basis functions in section 700-10 of FIG. 7. Accordingly, note that this second approach tends to lead to FIR filter coefficients with an even further reduced dynamic range compared to a constant sFact(k,φ), but this also typically comes at a cost of correction performance.

Eqn. 2.1 is provided by way of example only as an equation that provides a normalized sectioned non-linear basis function set. Other normalized sectioned non-linear basis function sets may be realized using alternative equations in some embodiments of the present invention.

Figure 4:
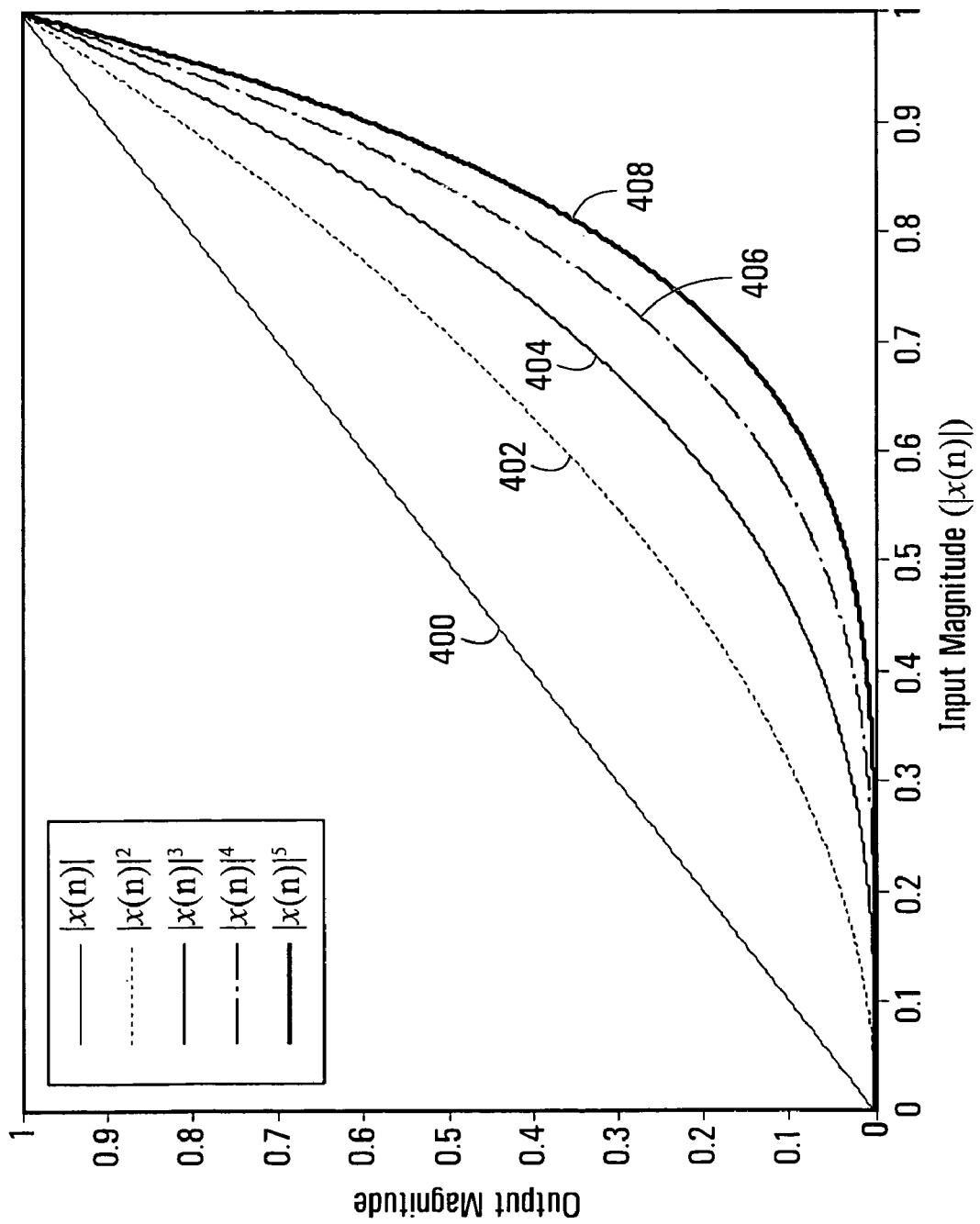
FIG. 4 is a plot of input magnitude vs. output magnitudes of the underlying global basis functions of a conventional global basis function based predistortion actuator.
Figure 9:
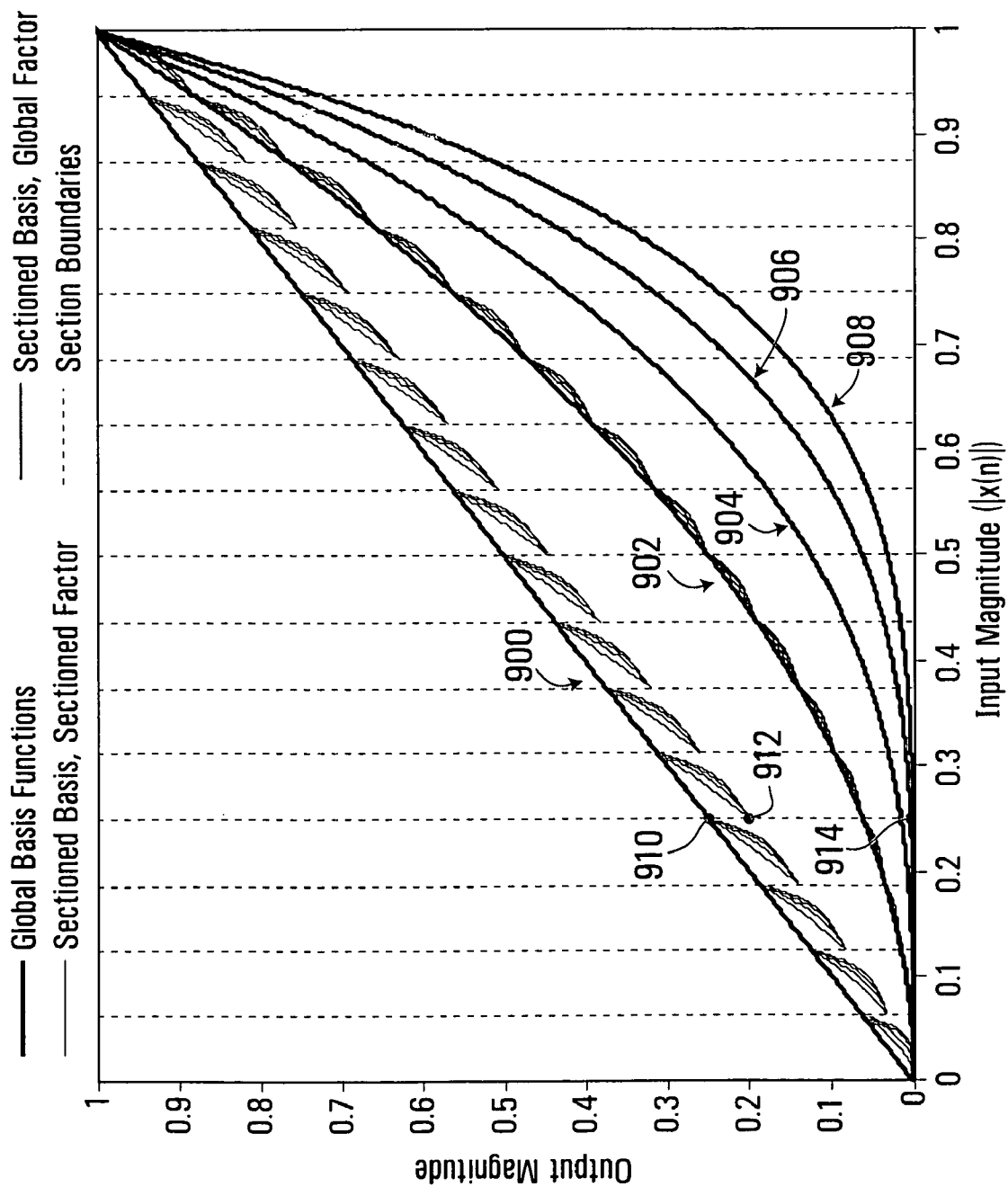
FIG. 9 is a plot illustrating the difference in dynamic range of the output magnitudes of the sectioned basis functions illustrated in FIGS. 7 and 8 and the conventional global basis functions illustrated in FIG. 4.

A comparison of the two sets of sectioned basis functions illustrated in FIGS. 7 and 8 against the typical global basis functions, such as those illustrated in FIG. 4, is shown in FIG. 9. The reduction in the dynamic range of the coefficients in the branches of the sectioned basis function predistorters is evident from the reduced relative differences between the outputs of the sectioned basis functions. For example, the ratio between the point 910 on the first order basis function output 900 (common to both the sectioned and global first order basis functions) and the point 912 on the fifth order sectioned basis function with sFact(k,φ) varied on a per section basis is approximately 0.25/0.2=1.25, whereas the ratio between the first order conventional global basis function at 910 and the fifth order conventional global basis function at 914 is $0.25/0.25^5=256$. It is noted that the ratio of the first order sectioned basis function output 900 to the outputs of the second through fifth order sectioned dynamic basis functions outputs with sFact(k,φ) varied on a per section basis is substantially the same as the ratio of the first order global basis function output 900 to the second order global basis function output 902, whereas the ratio of the first order global basis function output 900 to the third through fifth order global basis function outputs 904, 906 and 908, respectively is substantially higher than the ratio to the second order global basis function output 902.

Note that, in general, the fewer the number of sections, the larger the relative difference between the output magnitudes of the basis functions, and hence the required dynamic ranges of the coefficients φ for each basis function will potentially be larger.

In order to determine the predistortion actuator coefficients, for example, the coefficients $φ_{0,0}$ to $φ_{K,Q}$ of the FIR filters 504-0 to 504-K for the predistortion actuator 500 of FIG. 5, that result in a desired predistortion characteristic a coefficient training algorithm is used.

The operation of a predistortion actuator coefficient training algorithm will now be discussed with reference to FIG. 15.

Figure 15:
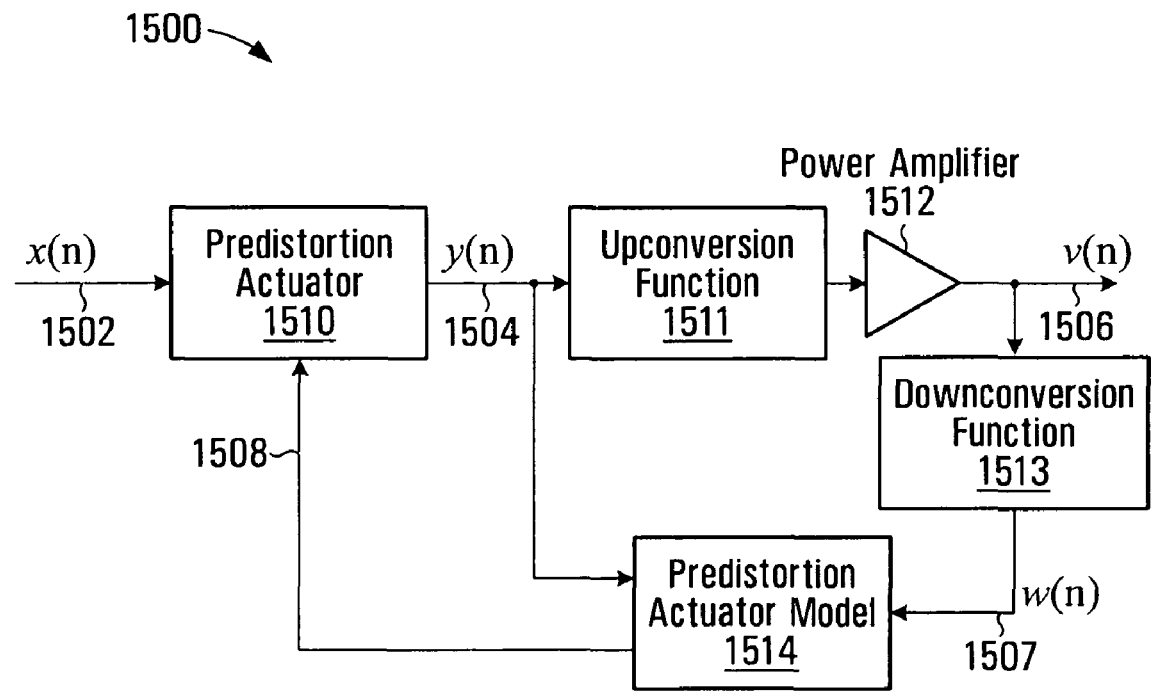
FIG. 15 is a schematic diagram of a power amplifier system with digital predistortion in accordance with an embodiment of the present invention.

FIG. 15 is a schematic diagram of a power amplifier system 1500 with digital predistortion in accordance with an embodiment of the present invention. The power amplifier system 1500 includes a predistortion actuator 1510, an upconversion function 1511, a power amplifier 1512, a downconversion function 1513 and a predistortion actuator model 1514. The predistortion actuator 1510 may, for example, have a schematic architecture similar to that of the predistortion actuator 500 shown in FIG. 5 or the predistortion actuator 600 shown in FIG. 6.

A signal input of the predistortion actuator 1510 is connected to an input of the power amplifier system 1500 to receive digital input signal x(n) 1502. An input of the upconversion function 1511 and a first input of the predistortion actuator model 1514 are connected to an output of the predistortion actuator 1510 to receive predistorted input signal y(n) 1504. An output of the upconversion function 1511 is connected to an input of the power amplifier 1512. The upconversion function 1511 is configured to convert the baseband predistorted input signal y(n) 1504 to a corresponding RF signal that is provided as an input to the power amplifier 1512. An RF output signal v(n) 1506 is generated at an output of the power amplifier 1512, which is connected to an output of the power amplifier system 1500 and to an input of the downconversion function 1513. The downconversion function 1513 converts the RF output signal v(n) 1506 to a corresponding baseband signal w(n) 1507 that is also attenuated by the gain (A) of the power amplifier 1512. A downconverted signal w(n) 1507 is generated at an output of the downconversion function 1513, which is connected to a second input of the predistortion actuator model 1514. The downconversion function 1513 is configured to "undo" the upconversion and amplifying functionality of the upconversion function 1511 and the power amplifier 1512, respectively, so that the baseband signal w(n) 1507 can be compared to the baseband signal y(n) 1504, as described below. A coefficient output of the predistortion actuator model 1514 is connected to a coefficient input of the predistortion actuator 1510 so that predistortion actuator coefficients φ 1508 can be passed from the predistortion actuator model 1514 to the predistortion actuator 1510.

In operation, the role of the predistortion actuator 1510 is to apply predistortion to the digital input signal x(n) 1502 such that the baseband digital output signal w(n) 1507 at the output of the downconversion function 1514 is approximately equal to the digital input signal x(n), i.e.:

$$w(n) \approx x(n). \tag{3.1}$$

What constitutes an acceptable approximation, indicated by the ≈ symbol in Eqn. 3.1, may, for example, be determined by a linearity requirement that can, for example, potentially be indirectly inferred from one or more of the criterion associated with a regulatory emission requirement.

The actual baseband digital output signal w(n) 1507 can be expressed as:

$$w(n) = f_{PA}(f_{PD}(x(n))), \tag{3.2}$$

where $f_{PD}(\cdot)$ is the nonlinear function associated with the predistortion actuator 1510 and $f_{PA}(\cdot)$ is the equivalent baseband nonlinear function associated with the power amplifier 1512 normalized according to the desired linear gain factor A.

In order to satisfy Eqn. 3.1, the predistortion applied by the predistortion actuator 1510, i.e., the nonlinear function $f_{PD}(\cdot)$ of the predistortion actuator 1510, which is a function of the predistortion coefficients of the predistortion actuator, must be such that the predistortion transfer function $f_{PD}(\bullet)$ is approximately the inverse of the nonlinear distortion of the transfer function $f_{PA}(\bullet)$ of the power amplifier 1512, i.e., $$f_{PA}(f_{PD}(x(n))) \approx x(n) \quad (3.3)$$

The predistorted digital input signal y(n) 1504 at the output of the predistortion actuator 1510 can be expressed as:

$$y(n) = f_{PD}(x(n)). \quad (3.4)$$

While the baseband digital output signal w(n) 1507 at the output of the downconversion function 1513 can be expressed as:

$$w(n) = f_{PA}(y(n)). \quad (3.5)$$

Substituting Eqn. 3.4 into Eqn. 3.5 yields:

$$w(n) = f_{PA}(f_{PD}(x(n))). \quad (3.6)$$

The predistortion actuator model 1514 receives both the predistorted baseband digital input signal y(n) 1504 from the output of the predistortion actuator 1510 and the output baseband digital signal w(n) 1507 from the output of the downconversion function 1513. The predistortion actuator model 1514 utilizes a coefficient training algorithm to determine a set of coefficients φ that result in a transfer function $f_{PD\_MODEL}(\bullet)$ for the predistortion actuator model 1514 that is approximately the inverse of the non-linear function $f_{PA}(\bullet)$ of the power amplifier 1512, i.e.:

$$f_{PD\_MODEL}(w(n)) \approx y(n). \quad (3.7)$$

Substituting Eqn. 3.5 into Eqn. 3.7 results in:

$$f_{PD\_MODEL}(f_{PA}(y(n))) \approx y(n). \quad (3.8)$$

From Eqn. 3.8, it can be seen that the function $f_{PD\_MODEL}(\bullet)$ is the inverse of the function $f_{PA}(\bullet)$.

In other words, setting the coefficients of the predistortion actuator 1510 equal to the coefficients for the predistortion actuator model 1514 that were determined to satisfy Eqn. 3.6 and Eqn. 3.8 would yield a function $f_{PD}(\bullet)$ for the predistortion actuator 1510 according to:

$$f_{PD}(\bullet) = f_{PD\_MODEL}(\bullet) \approx f_{PA}^{-1}(\bullet), \quad (3.9)$$

thereby satisfying Eqn. 3.1 and Eqn. 3.3.

During training, in order to determine the predistortion actuator coefficients that satisfy Eqn. 3.9, a training signal is applied to the input of the predistortion actuator 1510 and the coefficients for the predistortion actuator model 1514 are determined as described above to satisfy Eqn. 3.8. Those coefficients are then passed to the predistortion actuator 1510. This process is repeated iteratively to refine the values of the predistortion actuator coefficients φ.

In some embodiments, the dynamic range of sectioned basis function based predistortion actuator coefficients, such as the coefficients of the FIR filters 504-0 to 504-K in FIG. 5 and 604-0 to 604-K in FIG. 6, can be further reduced by applying signal conditioning in order to control the "floors" of the training signals involved in the coefficient calculation/training process.

An example of the potential effects of signal conditioning are now discussed with reference to FIGS. 10 and 11.

Figure 10:
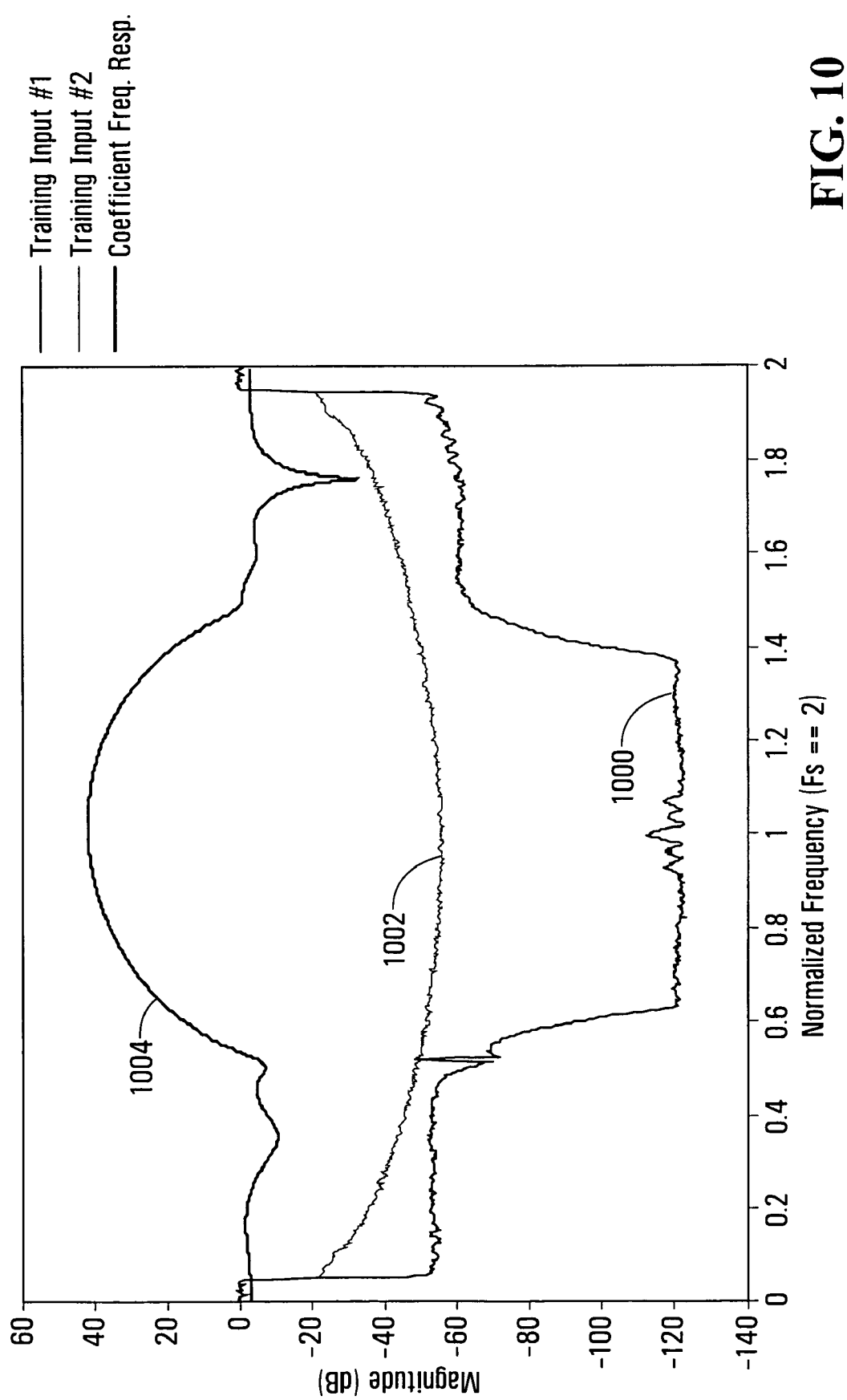
FIG. 10 is a plot illustrating the effect training signals with large dynamic ranges may have on the dynamic range of the coefficients calculated to implement the sectioned basis functions in accordance with an embodiment of the present invention.

FIG. 10 is a plot of the coefficient frequency response 1004 for coefficient training with two training signals 1000, 1002, one of which 1000 has an extremely low relative signal power (approx. −120 dB) around the normalized frequency 1, where the normalized sampling frequency is defined to be $F_s=2$.

In feedback receivers, this type of signal, i.e., the extremely low signal power signal 1000, is typically seen at the input to a predistortion actuator due to an analog band limiting filter.

As can be seen from FIG. 10, the signal floor difference at normalized frequency 1 between the first training signal 1000 and the second training signal 1002 can effectively give the coefficient calculation algorithm additional degrees of freedom in the affected region, which is illustrated by the increase in the coefficient frequency response 1004 over the frequency band in which the first training signal 1000 has such low signal power. The calculated predistortion actuator coefficients can become unnecessarily large as a result.

By controlling the quantization levels in the training signals, or by artificially adding a noise floor, this effect can potentially be mitigated. For example, by increasing the noise floor of the first training input 1000 to approximately −65 dB, the result given in FIG. 11 can be obtained.

Figure 11:
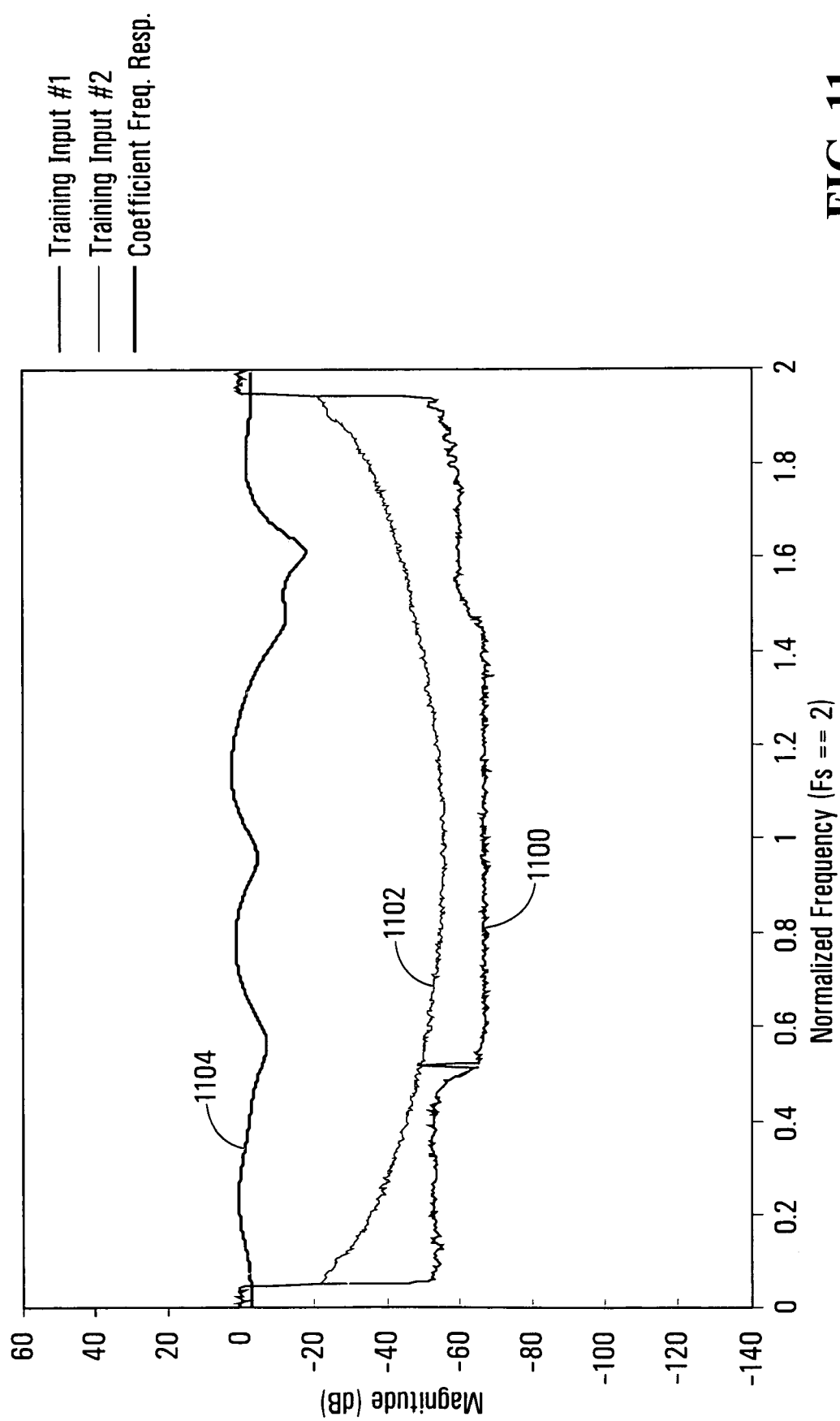
FIG. 11 is a plot illustrating the potential reduction in the dynamic range of the coefficients calculated to implement the sectioned basis functions as a result of signal conditioning to reduce the dynamic range of the training signals used during coefficient training in accordance with an embodiment of the present invention.

FIG. 11 is a plot of coefficient frequency response 1104 for coefficient training with two training signals 1100 and 1102. The second training signal 1102 is the same as the second training signal 1002 of FIG. 10, but the first training signal 1100 has an elevated noise floor of −65 dB in contrast to the approx. −120 dB noise floor of the first training signal 1000 of FIG. 10. The coefficient frequency response 1104 of FIG. 11 is not elevated over the normalized frequency range of 0.6 to 1.4 in comparison to the coefficient frequency response 1004 of FIG. 10. It has been demonstrated that the resulting relatively benign filter response (e.g. low gain near $F_s/2$) of a complex FIR filter resulting from the coefficients determined using training signals such as 1100 and 1102 shown in FIG. 11 can potentially lead to an 8× reduction in the maximum coefficient values compared to the original set of actuator coefficients for the filter response 1004 illustrated in FIG. 10.

To illustrate the impact of different basis function options, the correction performance and coefficient dynamic range using the same set of training signals are now discussed with reference to FIGS. 12 to 14.

Figure 12:
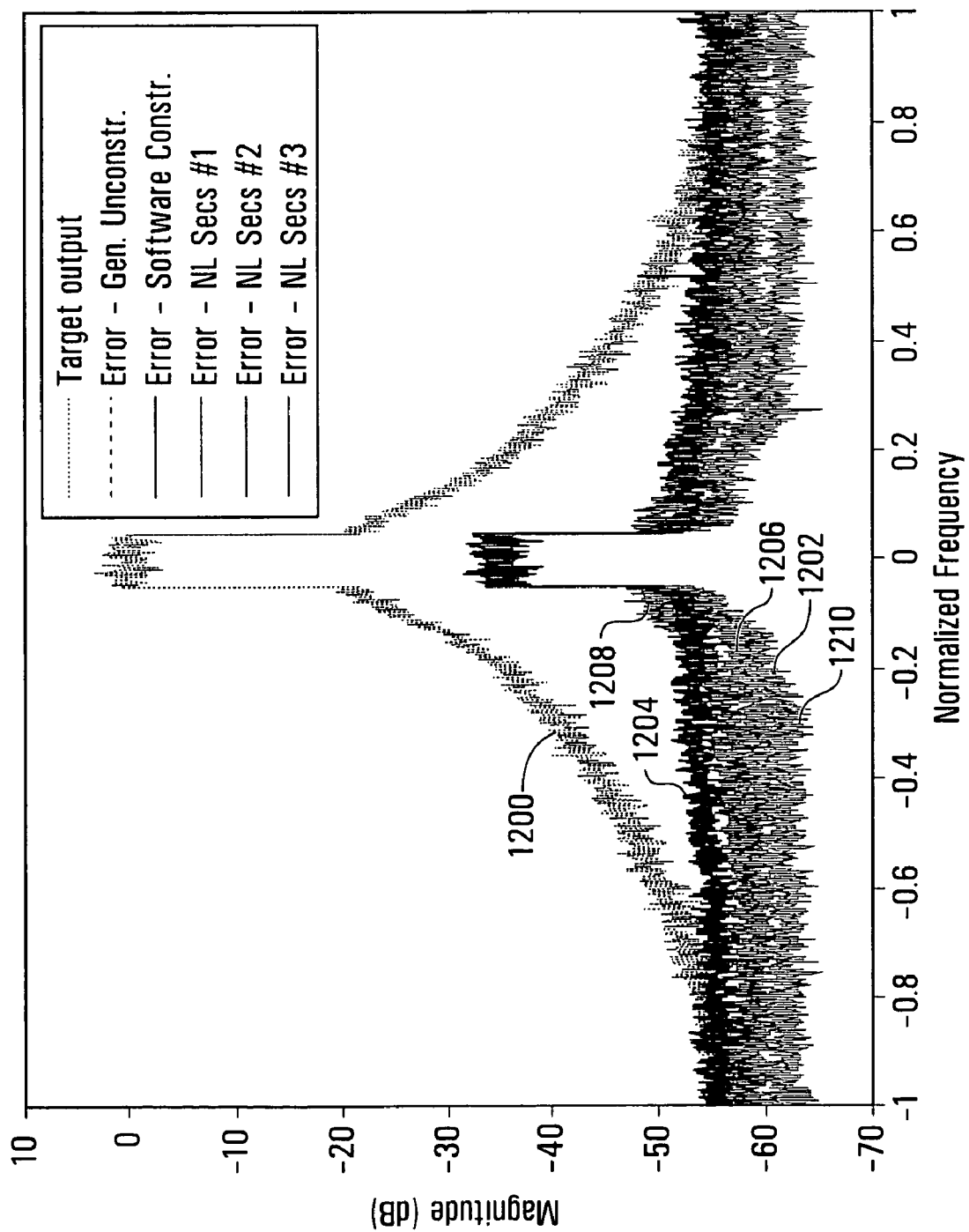
FIGS. 12 and 13 are plots of a target output and the correction errors associated with the outputs generated subsequent to training with and without input signal conditioning of the training signals, respectively, for: a predistortion actuator with conventional global non-linear basis functions; a predistortion actuator with conventional software-constrained coefficient values when using global non-linear basis functions; a predistortion actuator with sectioned basis functions with a global normalization factor for each branch of the predistortion actuator in accordance with an embodiment of the present invention; a predistortion actuator with sectioned basis functions with a sectioned normalization factor for each branch of the predistortion actuator in accordance with an embodiment of the present invention; and a hybrid predistortion actuator with a combination of global and sectioned basis functions in accordance with an embodiment of the present invention.
Figure 13:
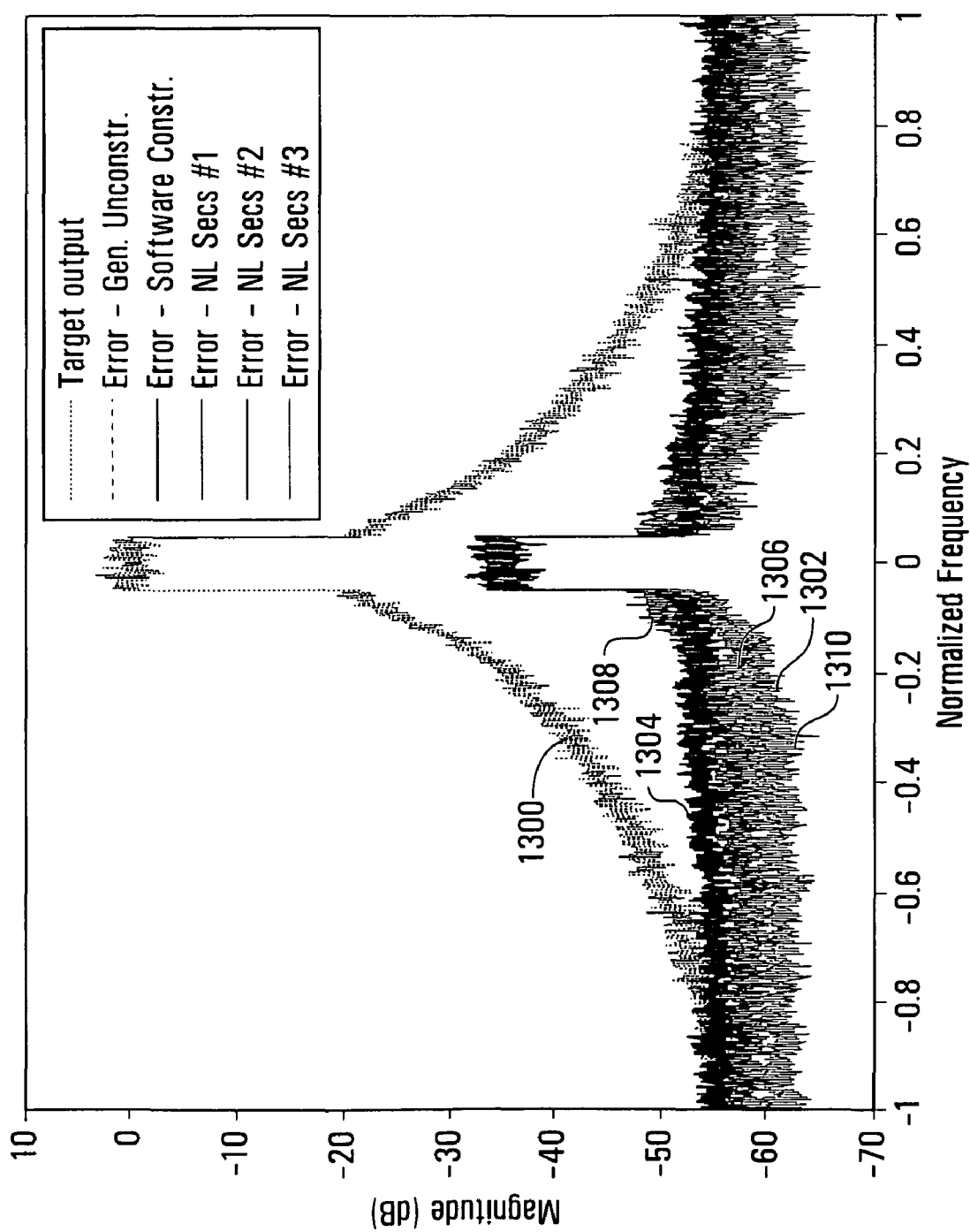

It should be noted that the comparative results illustrated in FIGS. 12 to 14 are based on very specific examples of conventional predistorters and very specific embodiments of the present invention that are provided for illustrative purposes only and should only be viewed as the potential relative benefits of very specific embodiments of the present inventions as compared to very specific implementations of conventional predistortion techniques, and should not be viewed as determinative of the relative benefits of all embodiments of the present invention.

Figure 3:
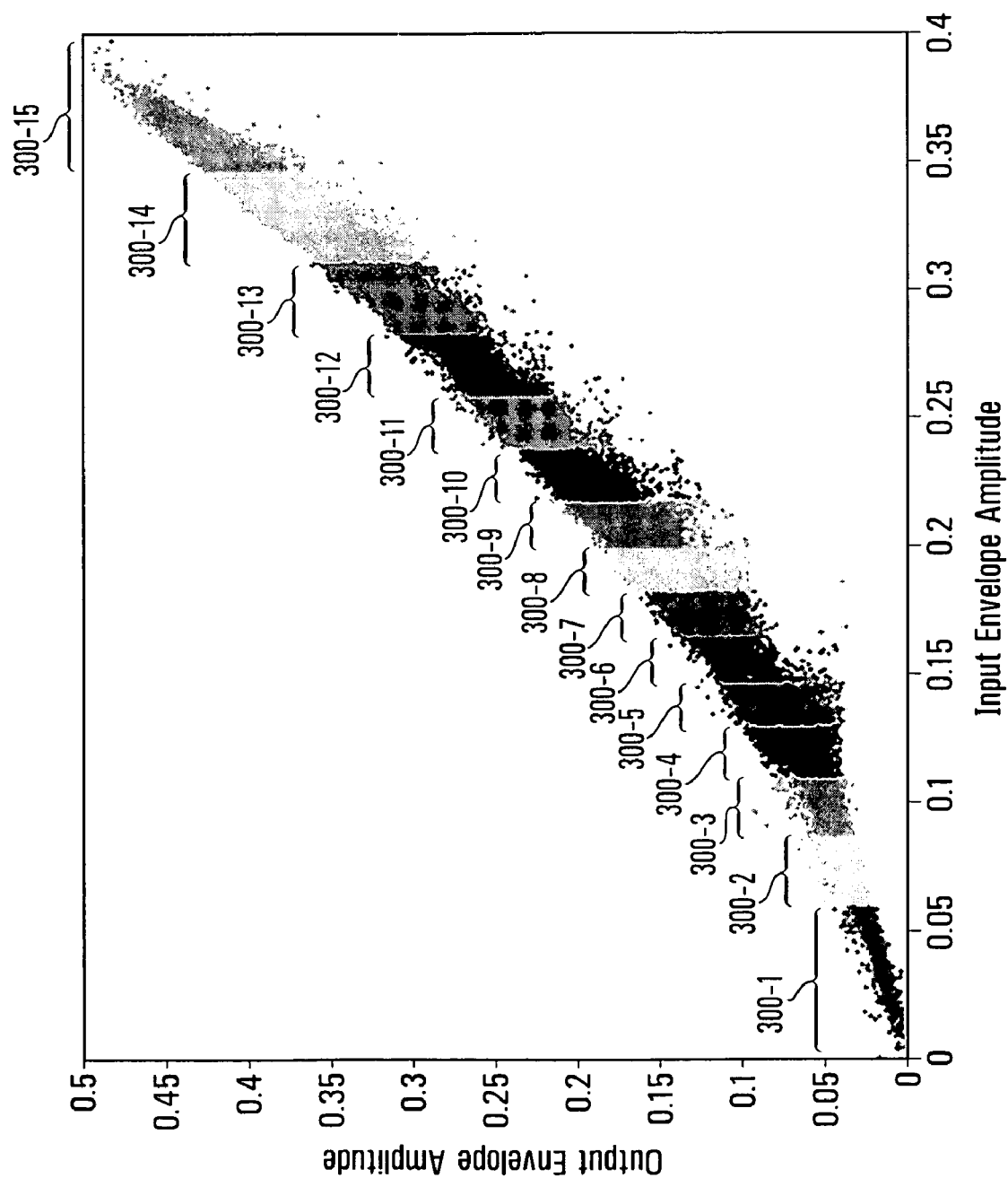
FIG. 3 is a plot of an input envelope amplitude vs. output envelope amplitude characteristic of a conventional predistortion actuator with sectioned coefficients.

FIGS. 12 and 13 are plots of the spectrum of the correction error and the target output signal for predistortion with and without signal conditioning, respectively, for various conventional predistortion approaches and various predistortion approaches in accordance with embodiments of the present invention. Note that in FIGS. 12 and 13 the error "Gen. Unconstr." 1202, 1302 refers to the correction error for typical global, i.e., non-sectioned, basis functions, the error "Software Constr." 1204, 1304 refers to the correction error for typical global basis functions whose coefficients are constrained via added complexity in the training algorithm, such as the conventional sectioned coefficient approach discussed above with reference to FIG. 3, the error "NL Secs Type #1" 1206, 1306 refers to the correction error for sectioned basis functions with a global normalization factor, such as sFact(k,φ) in the exemplary sectioned basis function provided in Eqn. 2.1 with sFact(k,φ) being held constant across sections and branches, the error "NL Secs Type #2" 1208, 1308 refers to the correction error for sectioned basis functions with a section based normalization factor, such as sFact(k,φ) in the exemplary sectioned basis function provided in Eqn. 2.1 with sFact(k,φ) being varied across sections, but held constant across branches, and the error "NL Secs Type #3" 1210, 1310 refers to the correction error for predistortion using a hybrid of sectioned and non-sectioned basis functions.

The largest maximum value of the resulting actuator coefficients is given in the table provided in FIG. 14. Note that the inputs and outputs of the actuator are represented as fractional values. Consequently, if the coefficients have magnitudes that are greater than 1, the size of the actuator's internal arithmetic units will have to be increased such that the operands and the arithmetic results can be represented. The number of additional bits required for the various approaches is listed in the third and fifth columns of the table shown in FIG. 14 for training without and with signal conditioning, respectively. For example, the largest absolute coefficient value for general unconstrained global basis functions without signal conditioning is 673336.277, which would require 20 additional bits of precision to represent over the bits required to represent x(n).

In comparing the typical global basis functions versus the sectioned basis functions, it can be seen that coefficient dynamic range can be reduced, with some impact on correction performance. For example, the correction error 1206, 1306 for sectioned basis function with a global normalization factor is comparable to the correction errors 1202, 1302 for general unconstrained global basis functions, while the dynamic range of the coefficients has been reduced by several orders of magnitude (largest absolute coefficient values reduced from 673336.27 to 51.64 (without signal conditioning) and from 598742.618 to 9.911 (with signal conditioning) for sectioned basis functions using global normalization factors relative to the general unconstrained global basis functions, as shown in the table of FIG. 14).

In this particular example, this dynamic range reduction could potentially translate into approximately a 40% reduction in the area in the corresponding hardware realization of the actuator. Also note that the use of signal conditioning reduced the additional wordlength requirements by 30% or more for the sectioned basis function predistortion actuators.

In some embodiments, the training data associated with a section is updated and captured based on time duration relative to some event.

In some embodiments, the operating boundaries of the actuator sections are adaptively adjusted to potentially further reduce coefficient dynamic range. In some embodiments, the operating boundaries of at least a subset of the sections may be adapted to substantially equalize the number of input signal samples that are likely to fall within each section. Note that in general, the fewer the number of sections, and hence the larger the range of the sections (assuming the total collective range of the sections is held constant), the larger the potential relative difference between the output magnitudes of the basis functions, and hence the larger the potential dynamic ranges of the coefficients $\phi$ for each basis function. Accordingly, whether selected adaptively or statically, the number of sections and/or the range over which individual sections are defined, is an implementation specific detail that may be determined having regard to trade-offs between, for example, circuit complexity/cost resulting from including more sections and circuit complexity/cost resulting from increased dynamic range requirements potentially associated with fewer sections and/or larger sections.

While the embodiments shown in FIGS. 5 and 6 include separate parallel processing branches, each having separate digital processing elements, such as the FIR filters 504-0 to 504-K and 610-0 to 610-K in FIGS. 5 and 6, respectively, more generally, any number of arrangements of digital processing components are contemplated that may be utilized in order to realize the functionality provided by the specific implementations provided by way of example in FIGS. 5 and 6. For example, with reference to FIG. 5, rather than using a separate FIR filter for each branch, an FIR filter running at a multiple M, where M is an integer, of the sample frequency of the digital input signal, could potentially be used to filter the outputs of up to M of the sectioned basis function blocks 502-0 to 502-K.

Some embodiments of the present invention can potentially be applied to systems that include a non-linear amplifier, such as, for example, cellular base stations (e.g. CDMA (Code Division Multiple Access), UMTS (Universal Mobile Telephone System), 4G base stations (such as WiMAX, LTE (Long Term Evolution) and "Whitespace") and wireless networking devices (e.g. IEEE 802.11 compliant networking devices).

In some embodiments, the predistortion system is implemented on an application specific integrated circuit on a radio transmitter, and is paired with a dual-input Doherty amplifier, such as that described in Applicant's co-pending U.S. Patent Application Publication No. 2008/0088369 filed Apr. 17, 2008, the entire content of which is hereby incorporated by reference in its entirety.

The foregoing description includes many detailed and specific embodiments that are provided by way of example only, and should not be construed as limiting the scope of the present invention. Alterations, modifications and variations may be effected to the particular embodiments by those of skill in the art without departing from the scope of the invention, which is defined solely by the claims appended hereto.

The invention claimed is:

1. A predistortion actuator for predistorting a digital input signal, the predistortion actuator comprising: a plurality of branches that each implement a respective basis function, wherein for each of at least one of the plurality of branches, the respective basis function is a sectioned basis function having a respective distinct definition for each section of a respective plurality of sections, the respective plurality of sections defining a range of at least one input signal characteristic associated with the digital input signal.

2. The predistortion actuator of claim 1, wherein the at least one of the plurality of branches comprises all of the plurality of branches.

3. The predistortion actuator of claim 2, wherein the respective plurality of sections is the same for each of the plurality of branches.

4. The predistortion actuator of claim 1, wherein the at least one input signal characteristic comprises magnitude of the digital input signal, such that each sectioned basis function has a respective distinct definition for each section of a respective plurality of sections defining a magnitude range of the digital input signal.

5. The predistortion actuator of claim 1, wherein the at least one input signal characteristic comprises a temporal characteristic of the digital input signal, such that each sectioned basis function has a respective distinct definition for each section of a respective plurality of sections defining a time period relative to some time marker associated with the digital input signal.

6. The predistortion actuator of claim 1, wherein the at least one input signal characteristic comprises a temporal characteristic of the digital input signal and magnitude of the digital input signal, such that each sectioned basis function has a respective distinct definition for each section of a plurality of sections defining both:
   a) a time period relative to some time marker associated with the digital input signal; and
   b) a magnitude range of the digital input signal.

7. The predistortion actuator of claim 1, wherein each sectioned basis function comprises a normalization factor that is held constant across each of the respective plurality of sections.

8. The predistortion actuator of claim 1, wherein each sectioned basis function comprises a normalization factor that varies on at least one of:
   a per section basis; and
   a per branch basis.

9. The predistortion actuator of claim 1, wherein each sectioned basis function is implemented according to:

$$f_k(x(n),\phi)=x(n)(\text{normEnv}(x(n),\phi)^k(\text{upperSecVal}(\phi)-\text{lowerSecVal}(\phi))+\text{lowerSecVal}(\phi))s\text{Fact}(k,\phi),$$

where $$\text{normEnv}(x(n),\phi) = \frac{|x(n)| - \text{lowerSecVal}(\phi)}{\text{upperSecVal}(\phi) - \text{lowerSecVal}(\phi)},$$

where k is a branch number, x(n) is the input signal, $\phi$ is a section number that is determined in accordance with $$\text{lowerSecVal}(\phi) \leq |x(n)| < \text{upperSecVal}(\phi),$$

where lowerSecVal and upperSecVal are vectors that define the lower and upper boundaries of each section, respectively, and sFact(k,$\phi$) is a normalization factor defined for each actuator branch k of the plurality of branches and section $\phi$ of the plurality of sections independently.

10. The predistortion actuator of claim 9, wherein for each sectioned basis function, the normalization factor sFact(k,$\phi$) is constant across the respective plurality of sections.

11. The predistortion actuator of claim 10, wherein the normalization factor sFact(k,$\phi$) is determined according to:

$$s\text{Fact}(k,\phi) = \frac{1}{\max(\text{upperSecVal}(\phi))},$$

where max(upperSecVal($\phi$)) is the maximum upper section value of the vector of upper section values upperSecVal($\phi$) for all branches k and sections $\phi$.

12. The predistortion actuator of claim 9, wherein the normalization factor sFact(k,$\phi$) is determined according to:

$$s\text{Fact}(k,\phi) = \frac{1}{\text{upperSecVal}(\phi)}.$$

13. The predistortion actuator of claim 1, wherein for at least one of the sectioned basis functions, the section boundaries of the respective plurality of sections are adaptively adjusted.

14. The predistortion actuator of claim 1, wherein each branch of the plurality of branches comprises a Finite Impulse Response (FIR) filter arranged to respectively filter an output of the respective basis function of the respective branch.

15. The predistortion actuator of claim 14, further comprising:
   a plurality of adders arranged to collectively add outputs of the FIR filters to generate a predistorted digital signal.

16. The predistortion actuator of claim 14, wherein operation of each FIR filter is based on a respective set of filter coefficients, the predistortion actuator further comprising a distinct set of coefficients for each of the plurality of sections for each of the FIR filters.

17. The predistortion actuator of claim 16, further comprising a section determiner configured to:
   for each sample period of the digital input signal, determine a current section of the respective plurality of sections based on a current value of the at least one input signal characteristic of the digital input signal, and select a respective one of the distinct sets of coefficients for the respective FIR filter of each of the plurality of branches based on the current section.

18. The predistortion actuator of claim 1, wherein for each sectioned basis function:
   a respective set of coefficients for each section of the plurality of sections is determined using a coefficient training algorithm comprising training signal conditioning.

19. A power amplifier system, comprising:
   a predistortion actuator according to claim 1 configured to predistort a baseband digital input signal to generate a predistorted baseband digital signal;
   an upconversion function configured to generate a predistorted radio frequency (RF) signal corresponding to the predistorted baseband digital signal;
   a predistortion actuator model configured to determine predistortion coefficients for each of the branches of the predistortion actuator, wherein the predistortion actuator predistorts the baseband digital input signal based on the predistortion coefficients;
   a power amplifier configured to amplify the predistorted RF signal to generate an RF output signal; and
   a downconversion function configured to generate a baseband digital output signal corresponding to the RF output signal,
   wherein the predistortion actuator model determines the predistortion coefficients for each of the branches of the predistortion actuator based on the baseband digital output signal and the predistorted baseband digital signal.

20. The power amplifier system of claim 19, wherein each sectioned basis function comprises a normalization factor that varies on at least one of:
   a per section basis; and
   a per branch basis.

* * * * *